(12) United States Patent
Hayakawa

(10) Patent No.: US 7,368,802 B2
(45) Date of Patent: May 6, 2008

(54) PHASE-CHANGE MEMORY DEVICE AND METHOD OF MANUFACTURING SAME

(75) Inventor: Tsutomu Hayakawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/563,643

(22) Filed: Nov. 27, 2006

(65) Prior Publication Data
US 2007/0120107 A1 May 31, 2007

(30) Foreign Application Priority Data
Nov. 26, 2005 (JP) .............................. 2005-341290

(51) Int. Cl.
*H01L 29/00* (2006.01)
(52) U.S. Cl. ............... 257/529; 257/528; 257/E45.002; 438/142; 438/197; 438/238
(58) Field of Classification Search .................... None
See application file for complete search history.

(56) References Cited

U.S. PATENT DOCUMENTS

2006/0076641 A1* 4/2006 Cho et al. ................... 257/528

FOREIGN PATENT DOCUMENTS

JP 2003-332529 A 11/2003

* cited by examiner

*Primary Examiner*—A. Sefer
*Assistant Examiner*—Kevin Quinto
(74) *Attorney, Agent, or Firm*—Sughrue Mion, PLLC

(57) ABSTRACT

A phase-change memory device has a phase-change layer, a heater electrode having an end held in contact with the phase-change layer, a contact plug of different kinds of material having a first electrically conductive material plug made of a first electrically conductive material and held in contact with the other end of the heater electrode, and a second electrically conductive material plug made of a second electrically conductive material having a specific resistance smaller than the first electrically conductive material, the first electrically conductive material plug and the second electrically conductive material plug being held in contact with each other through at least respective side surfaces thereof, the heater electrode and the second electrically conductive material plug being not in overlapping relation to each other, and an electrically conductive layer electrically connected to the second electrically conductive material plug.

20 Claims, 24 Drawing Sheets

Fig. 1

|   | IV | V | VI | VII |
|---|----|---|----|-----|
| 1 |    |   |    |     |
| 2 |    |   | O  |     |
| 3 | Si | P | S  | Cl  |
| 4 | Ge | As| Se | Br  |
| 5 | Sn | Sb| Te | I   |

US 7,368,802 B2

PHASE-CHANGE MEMORY DEVICE AND METHOD OF MANUFACTURING SAME

This application is based upon and claims the benefit of priority from Japanese Patent Application No. 2005-341290 filed on Nov. 26, 2005, the content of which is incorporated by reference.

BACKGROUND OF THE INVENTION

1. Field of the Invention

The present invention relates to a phase-change memory device and a method of manufacturing a phase-change memory device.

2. Description of the Related Art

Phase-change memory devices employ in their memory cells a phase-change layer (a chalcogenide semiconductor thin film or the like) whose electrical resistance changes depending on its state. Chalcogenide semiconductors are amorphous semiconductors including chalcogen elements.

Figure 1:
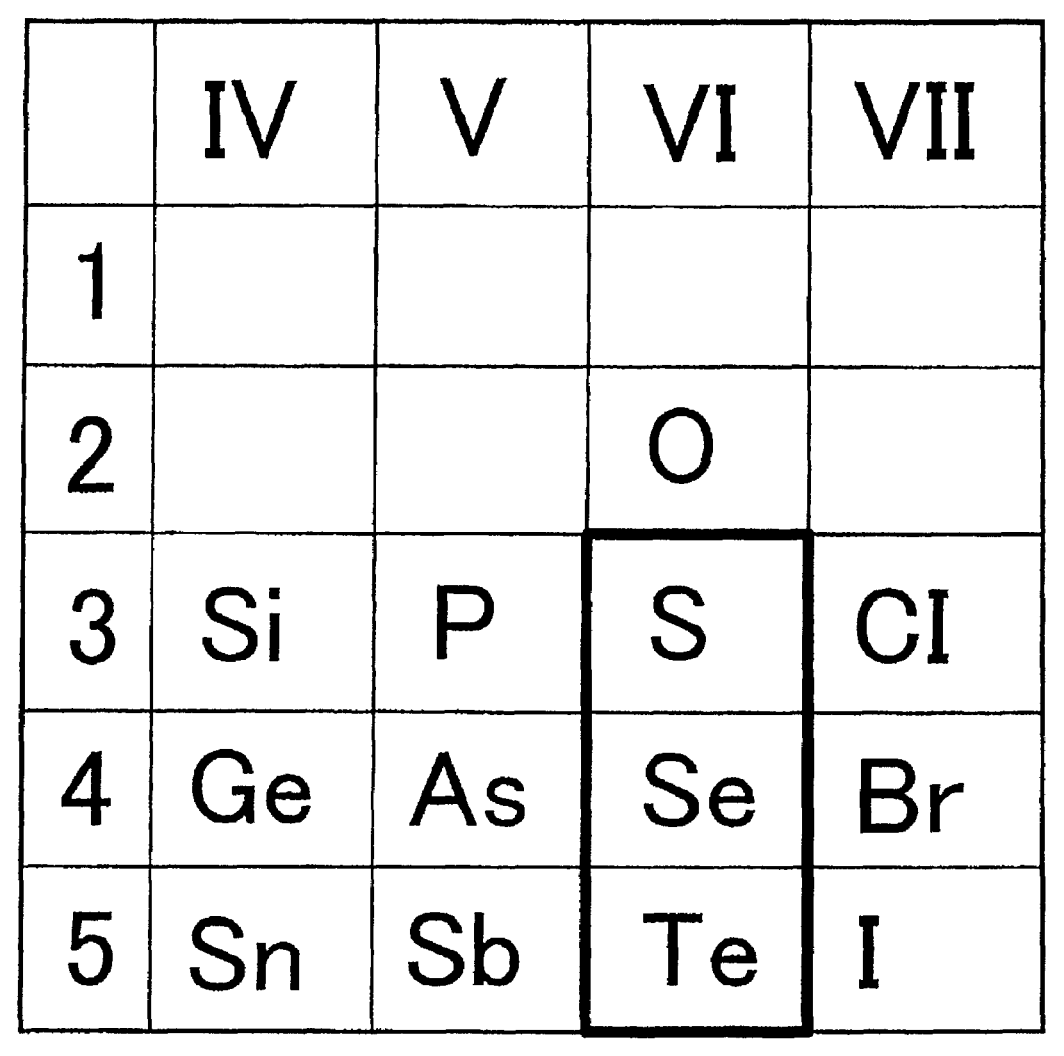

FIG. 1 of the accompanying drawings shows a portion of the periodic table which is illustrative of chalcogen elements. As shown in FIG. 1, chalcogen elements include S (Sulfur), Se (Selenium), and Te (Tellurium) in group 6 in the periodic table. Chalcogenide semiconductors are used in generally two fields, optical disks and electric memories. Chalcogenide semiconductors used in the field of electric memories include GeSbTe (hereinafter referred to as "GST") which is a compound of Ge (Germanium), Te (Tellurium), and Sb (Antimony), AsSbTe, SeSbTe, etc.

FIGS. 2A and 2B of the accompanying drawings are diagrams illustrative of the principles of a phase-change memory.

As shown in FIG. 2A, a chalcogenide semiconductor can take two stable states, i.e., amorphous state 10 and crystalline state 30. For switching from amorphous state 10 to crystalline state 30, the chalcogenide semiconductor needs to be supplied with heat in excess of energy barrier 20.

As shown in FIG. 2B, the amorphous state exhibits a higher electrical resistance corresponding to a digital value "1" and the crystalline state exhibits a lower electrical resistance corresponding to a digital value "0". This allows the chalcogenide semiconductor to store digital information. The amount of current flowing through the chalcogenide semiconductor or a voltage drop across the chalcogenide semiconductor is detected to determine whether the information stored in the chalcogenide semiconductor is "1" or "0".

Heat supplied to cause a phase change in the chalcogenide semiconductor is Joule heat. Specifically, pulses having different peak values and different pulse durations are applied to the chalcogenide semiconductor to generate Joule heat in the vicinity of contact surfaces of the electrodes and the chalcogenide semiconductor, and the Joule heat causes a phase change.

Specifically, after the chalcogenide semiconductor is supplied with heat at a temperature near its melting point, when the chalcogenide semiconductor is quickly cooled, it switches into the amorphous state. After the chalcogenide semiconductor is supplied with heat at a crystallizing temperature lower than the melting point for a long period of time, when the chalcogenide semiconductor is cooled, it switches into the crystalline state. For example, after the GST is supplied with heat at a temperature near the melting point (about 610° C.) for a short period of time (1 through 10 ns), when the GST is quickly cooled for about 1 ns, it switches into the amorphous state. After the GST is supplied with heat at a crystallizing temperature (about 450° C.) for a long period of time (30 through 50 ns), when the GST is cooled, it switches into the crystalline state.

As shown in FIG. 2B, switching from the amorphous state into the crystalline state is referred to as "setting" (crystallizing process), and a pulse applied to set the chalcogenide semiconductor is referred to as a "setting pulse". It is assumed that the minimum temperature (crystallizing temperature) required to crystallize the chalcogenide semiconductor is represented by Tc, and the minimum time (crystallizing time) required to crystallize the chalcogenide semiconductor is represented by tr. Conversely, switching from the crystalline state into the amorphous state is referred to as "resetting" (amorphizing process), and a pulse applied to reset the chalcogenide semiconductor is referred to as a "resetting pulse". Heat applied to the chalcogenide semiconductor for resetting the chalcogenide semiconductor is heat at a temperature near the melting point Tm. After the chalcogenide semiconductor is melted, it is rapidly quenched.

FIGS. 3A through 3D of the accompanying drawings are diagrams illustrating a basic structure of a phase-change memory device and the manner in which the phase-change memory device is set and reset.

As shown in FIG. 3A, the phase-change memory device is of a basic structure having chalcogenide semiconductor layer (phase-change layer) 46 sandwiched between upper and lower electrodes 48, 42. Lower electrode 42 is mounted on substrate 40 and isolated from upper electrode 48 by electric insulating film 44. Upper electrode 48 is connected to terminal P to which a setting pulse will be applied. Lower electrode 42 is connected to ground (reference electrode).

As shown in FIG. 3B, the phase-change memory device shown in FIG. 3A is equivalent to resistor R1. The resistance of resistor R1 varies depending on whether chalcogenide semiconductor layer 46 is in the amorphous state or the crystalline state. Setting pulse S1, i.e., a pulse having a peak value in excess of threshold value Vth, resetting pulse S2, i.e., a pulse having a peak value greater than setting pulse S1 and a shorter pulse duration than setting pulse S1, and reading pulse S3, i.e., a pulse having a peak value smaller than threshold value Vth and a longer pulse duration than setting pulse S1, are selectively applied to terminal P. Threshold value Vth represents a lower-limit voltage at which Joule heat required for crystallization can be generated.

FIG. 3C shows the relationship between setting pulse S1 and a temperature rise caused by the Joule heat that is generated when setting pulse S1 is applied to terminal P. In FIG. 3C, the upper curve represents the waveform of the voltage of setting pulse S1, and the lower curve 51 represents the manner in which the temperature increases due to the Joule heat.

The voltage value of setting pulse S1 is in excess of threshold value Vth, and the pulse duration of setting pulse S1 is represented by tcry. Pulse duration tcry is equal to or longer than crystallizing time tr, i.e., the minimum time required to crystallize the chalcogenide semiconductor. The temperature rise due to the Joule heat is considerably lower than melting point Tm and higher than minimum temperature Tc required for crystallization (crystallizing temperature).

Similarly, FIG. 3D shows the relationship between resetting pulse S2 and a temperature rise caused by the Joule heat that is generated when resetting pulse S2 is applied to terminal P. In FIG. 3D, the upper curve represents the waveform of the voltage of resetting pulse S2, and the lower curve 53 represents the manner in which the temperature increases due to the Joule heat.

As shown in FIG. 3D, resetting pulse S2 has a peak value much higher than threshold value Vth and a sufficiently small pulse duration. The temperature rise due to the Joule heat is in excess of melting point Tm of the chalcogenide semiconductor. The temperature falls from the peak value to crystallizing temperature Tc within sufficiently short time Tamo. Therefore, after the chalcogenide semiconductor is melted, it is quenched so that it returns to the amorphous state.

The phase-change memory device shown in FIGS. 3A through 3B has a circuit arrangement for supplying setting pulse S1 and resetting pulse S2 from terminal P. However, the phase-change memory device may have a circuit arrangement as shown in FIG. 4 of the accompanying drawings.

FIG. 4 is a circuit diagram of a circuit arrangement of the phase-change memory device.

In FIG. 4, resistor R1 is equivalent to the phase-change memory device and has an end connected to terminal P connected to power supply potential VDD. Resistor R1 has the other end connected to size-adjusted MOS transistors M1, M2, M3 having respective gates connected to setting pulse terminal P1, resetting pulse terminal P2, and reading pulse terminal P3, respectively.

Setting, resetting, and reading pulse signals are selectively applied to setting pulse terminal P1, resetting pulse terminal P2, and reading pulse terminal P3, respectively, to select which one of MOS transistors M1, M2, M3 is to be turned on, and to control the turn-on time of a selected one of MOS transistors M1, M2, M3. In this manner, the phase-change memory device operates in the setting, resetting, and reading modes.

FIG. 5 of the accompanying drawings is a circuit diagram showing the manner in which a phase-change memory device (phase-change memory IC) operates in a reading mode. Those parts shown in FIG. 5 which are identical to those shown in FIGS. 3A through 3D and 4 are denoted by identical reference characters.

In FIG. 5, a word line is represented by W, a ground line by G, a bit line (a pulse input line connected to terminal P for inputting setting pulse S1, resetting pulse S2, and reading pulse S3) by B, and a resistor equivalent to the phase-change memory device (comprising chalcogenide semiconductor layer 60) which serves as a memory cell by R1.

An NMOS transistor (switching device) for selecting a memory cell is represented by M4, a current-to-voltage converting resistor by R2, a sense amplifier by A1, a reference voltage source for sense amplifier A1 by 62, a current flowing through the memory cell in the reading mode by I1, and an output voltage of sense amplifier A1 (sensing output) by Vout.

In the setting mode (also in the resetting mode and the reading mode), word line W is activated to turn on NMOS transistor M4. Thereafter, one of pulses S1, S2, S3 is supplied from terminal P. In the reading mode, reading pulse S3 is supplied from terminal P.

The resistance of resistor R1 varies and hence the amount of current I1 flowing therethrough varies depending on whether chalcogenide semiconductor layer 60 of the memory cell is in the amorphous state or the crystalline state. By converting the amount of current I1 into a voltage and reading the voltage, it is possible to determine whether information stored in the memory cell is "1" or "0".

FIG. 6 of the accompanying drawings is a fragmentary cross-sectional view showing specific structural details of a memory cell provided by a phase-change memory device (phase-change memory IC).

In FIG. 6, p-type semiconductor substrate 70 has n-type source layer 71 and n-type drain layer 72 disposed therein, and gate electrode 74 connected to word line W is disposed on gate insulating film 73 that is disposed on p-type semiconductor substrate 70.

Interlayer insulating films 75, 79 are disposed on gate insulating film 73. An electrode connected to n-type source layer 71 comprises contact plug 76 extending through interlayer insulating film 75 and gate insulating film 73 and electrode 78 connected to contact plug 76 and comprising a first conductive layer disposed in interlayer insulating film 79. The electrode is connected to ground line G.

Contact plug 77 made of tungsten (W), for example, extends through interlayer insulating film 75 and is connected to n-type drain layer 72. Contact plug 80 serving as a heater electrode extends through interlayer insulating film 79 and is connected to contact plug 77.

Phase-change layer 82 comprising a chalcogenide semiconductor is disposed on interlayer insulating film 79 with adhering layer 81 in the form of a thin metal film being interposed therebetween. Adhering layer 81 is interposed to hold phase-change layer 82 and interlayer insulating film 79 closely together because phase-change layer 82 and interlayer insulating film 79 will not adhere closely to each other.

Upper electrode 83 comprising a second conductive layer is disposed on phase-change layer 82 and extends over its upper surface. Interlayer insulating film 84 is disposed on upper electrode 83. Contact plug 85 connected to upper electrode 83 extends through interlayer insulating film 84. Electrode 86 comprising a third conductive layer is disposed on interlayer insulating film 84 and connected to contact plug 85. Electrode 86 serves as pulse supply terminal P. Contact plug 85 and electrode 86 jointly make up a contact electrode.

Phase-change layer 82 includes a region surrounded by thick dotted line X, where a phase change occurs. Electrode 80 made of titanium nitride (TiN) is embedded in interlayer insulating film 79. Electrode 80 constricts a current flowing through phase-change layer 82 to increase the current density for efficiently generating Joule heat in phase-change region X. Therefore, electrode 80 is called a heater electrode (heating electrode), and will hereinafter referred to as heater electrode 80.

The current density of the current flowing through phase-change layer 82 increases and the generated Joule heat increases as the area of contact between heater electrode 80 and phase-change layer 82 decreases. Consequently, the area of contact between heater electrode 80 and phase-change layer 82 is set to a sufficiently small area, e.g., an area determined by photolithographically designed minimum dimensions.

A phase-change memory device with the phase-change layer sandwiched between the upper and lower electrodes is disclosed in Japanese laid-open patent publication No. 2003-332529, for example. The publication also discloses that the lower electrode (heater electrode) has a pointed end to minimize the area of contact between the electrode and the phase-change layer in order to prevent the thermal efficiency from being lowered in the phase-change process of the phase-change memory device.

The inventor of the present invention has studied the phase-change memory device shown in FIG. 6 and found that it suffers various disadvantages as described below.

The phase-change memory device shown in FIG. 6 has a heat radiation route for transmitting heat generated in phase-change region X of phase-change layer 82 downwardly through heater electrode 80 to contact plug 77 and for radiating the heat from contact plug 77. The heat radiation route necessarily occurs because of the structure of the phase-change memory device.

It should be noted that contact plug 77 and heater electrode 80 are made of different materials, and the heat radiation capability of contact plug 77 is high due to the different materials.

Specifically, contact plug 77 is made of a material of low resistance, e.g., tungsten, for the purpose of reducing the electrical resistance of contact plug 77, and heater electrode 80 is made of a material of high resistance, e.g., titanium nitride, for the purpose of efficiently generating Joule heat. Since a metal material having a higher electrical conductivity (the reciprocal of electrical resistivity) has a higher thermal conductivity, contact plug 77 having a lower resistance, i.e., a higher electrical conductivity, has a higher thermal conductivity than heater electrode 80 having a higher resistance, i.e., a lower electrical conductivity. Therefore, contact plug 77 functions as a heat sink (heat radiating fin) having good heat radiating capability.

Inasmuch as a phase change of the chalcogenide semiconductor is caused by Joule heat generated when a current flows therethrough, it is not preferable for Joule heat to be radiated through the heater electrode and the contact plug and interconnections positioned beneath the heater electrode because the heat radiation would lead to a reduction in thermal efficiency.

Such a reduction in thermal efficiency does not pose a significant problem when a single phase-change memory device or a phase-change memory IC of low integration degree is made as a prototype. However, it could be a large problem when highly integrated phase-change memory ICs are actually mass-produced according to a microfabrication process.

Specifically, for manufacturing a phase-change memory device having high storage capacity, it is necessary to reduce the size of a memory cell, and it is important to reduce the resetting current, i.e., a current required to shift the phase-change layer from the crystalline state to the amorphous state. The structure wherein the contact electrode layer held in contact with the bottom surface of the phase-change layer functions as a heat sink (heat radiating fin) having good heat radiating capability is responsible for reducing the thermal efficiency and for preventing the amount of resetting current from being reduced.

If, on the other hand, the contact plug is made of a material of high resistance to reduce heat radiation from the contact plug, i.e., to increase the thermal efficiency, then the contact resistance between the contact plug and the semiconductor substrate increases, and the current flowing therethrough decreases. In this case, the size (width/length) of the transistor for selecting the memory cell needs to be increased, posing an obstacle to efforts to reduce an element size, i.e., to increase the storage capacity of the phase-change memory device.

It is thus difficult to design a phase-change memory device having suppressed heat radiation immediately below the heater electrode and reduced contact resistance between the heater electrode and the semiconductor substrate.

One solution is to bring contact plug 77 of tungsten, which is held in contact with the drain layer of an NMOS transistor, into contact with heater electrode 80 through a new contact plug made of the same material (TiN) as heater electrode 80, rather than into direct contact with heater electrode 80.

Specifically, for electrically connecting the semiconductor substrate and the heater electrode to each other, a contact plug of low resistance, made of tungsten, for example, having reduced contact resistance between itself and the semiconductor substrate is provided, and another contact plug made of the same material, e.g., titanium nitride, as the heater electrode is disposed on the contact plug having low resistance. The heater electrode made of titanium nitride, for example, is disposed on the contact plug having high resistance.

However, since the two contact plugs disposed in respective different layers are present between the semiconductor substrate and the heater electrode, the number of layers of the phase-change memory device increases, and the number of man-hours required to manufacture the phase-change memory device also increases. Furthermore, the two contact plugs may possibly be shifted in position with respect to each other. Accordingly, difficulty arises in mass-producing large-scale phase-change memory devices of this design.

The invention disclosed in Japanese laid-open patent publication No. 2003-332529 addresses heat radiation in the contact interface between the phase-change layer and the heater electrode, and does not refer to or suggest radiation of heat transmitted through the heater electrode from the lower electrode, as addressed by the present invention. The disclosure of the above publication does not present any solution to the radiation of heat referred to above. According to the disclosure of the above publication, the end of the heater electrode needs to be pointed at a sharp angle. The need to produce a heater electrode having a pointed end, however, tends to make a method of manufacturing a phase-change memory device complex.

SUMMARY OF THE INVENTION

It is an object of the present invention to make is possible to mass-produce large-scale phase-change memory devices having both good electrical characteristics and good thermal characteristics.

According to an aspect of the present invention, a phase-change memory device includes a phase-change layer, a heater electrode having an end held in contact with the phase-change layer, a contact plug of different kinds of material having a first electrically conductive material plug made of a first electrically conductive material and held in contact with the other end of the heater electrode, and a second electrically conductive material plug made of a second electrically conductive material having a specific resistance smaller than the first electrically conductive material, the first electrically conductive material plug and the second electrically conductive material plug being held in contact with each other through at least respective side surfaces thereof, the heater electrode and the second electrically conductive material plug being not in overlapping relation to each other, and an electrically conductive layer electrically connected to the second electrically conductive material plug.

The contact plug of different kinds of material is used to reduce heat radiation and achieve good electric conductivity. The contact plug is an electrode used to electrically connect an electronic circuit component to another electronic circuit component, and is generally embedded in electrical insulation film. The contact plug of different kinds of material refers to a composite contact plug made of at least two electrically conductive material layers (electrically conductive plugs) held in contact with each other through surfaces thereof. One conventional contact plug is of a structure which is formed by depositing a thin metal barrier, e.g., an auxiliary titanium layer to provide a good electrical connection with a lower silicon substrate, and thereafter embedding a metal having a small specific resistance, e.g., tungsten, in an insulating film. The conventional contact plug of this structure does not correspond to the "contact plug of different kinds of material" according to the present invention. The reason is that the portion of the conventional contact plug which positively functions as an electrode for interconnecting the electronic circuit components, i.e., the portion providing a current path, is made up of only the metal having a small specific resistance, e.g., tungsten, and the metal barrier is provided only for the purpose of manufacturing semiconductor devices better. The "contact plug of different kinds of material" according to the present invention includes at least two portions which positively function as electrodes for interconnecting the electronic circuit component, i.e., portions functioning as contact plugs, the two contact plugs being made of different electrically conductive materials and integrally combined into a composite contact plug. The electrically conductive materials of the "contact plug of different kinds of material" according to the present invention may also function as the metal barrier referred to above. The "contact plug of different kinds of material" according to the present invention is used to electrically interconnect a heater electrode and an electrically conductive layer, i.e., a diffused layer, a metal electrode, an interconnect, or another contact plug on the silicon substrate. The portion of the "contact plug of different kinds of material" according to the present invention which contacts the heater electrode is in the form of the first electrically conductive material plug that is made of the first electrically conductive material which has a greater specific resistance (a smaller electrical conductivity and a smaller thermal conductivity) than the second electrically conductive material, thereby reducing heat radiation from the first electrically conductive material plug. Therefore, thermal efficiency is improved when data is written in the phase-change memory device, i.e., when the phase-change memory device is reset. The second electrically conductive material of the second electrically conductive material plug has a smaller specific resistance (a greater electrical conductivity and a greater thermal conductivity) than the first electrically conductive material. The second electrically conductive material plug is effective in sufficiently reducing the overall electrical resistance of the contact plug of different kinds of material. The first and second electrically conductive material plugs are held in contact with each other through at least side surfaces thereof, and the heater electrode and the second electrically conductive material plug do not overlap each other. Since the second electrically conductive material plug is made of a material having high electrical conductivity, the electrical resistance of the electronic circuit is sufficiently low. As the heater electrode does not overlap the second electrically conductive material plug, heat transferred through the heater electrode is transmitted to the first electrically conductive material plug, but not to the second electrically conductive material plug directly therebeneath. The portion which is held in contact with the heater electrode is made of a material having low thermal conductivity for reduced heat radiation. Therefore, other electrodes and interconnects may be made of a metal material of low specific resistance such as tungsten (W) or aluminum (Al) or copper (Cu) that is used in silicon-based LSI circuits. Accordingly, a greater choice of materials that can be used is available, making it possible to manufacture a large-scale phase-change memory device. The specific resistance ($\rho$) is also called electric resistivity or volume resistivity, and the reciprocal ($1/\rho$) thereof is referred to as electrical conductivity which is also referred to as specific electrical conductivity. According to the present invention, the terms "specific resistance" and "electrical conductivity" will be used.

In the phase-change memory device according to the present invention, the contact plug of different kinds of material has a planar shape including a wider main body constructed of the second electrically conductive material plug, and a protrusion projecting from the main body and narrower than the main body, the protrusion being made of the first electrically conductive material, the heater electrode being connected to the protrusion.

The above phrase refers to specific details of the planar shape of the contact plug of different kinds of material, i.e., the planar shape of a contact hole defined in an interlayer insulating film. Specifically, the contact hole has a planar shape including a wider main body and a narrower protrusion. The narrower protrusion is fully filled with the first electrically conductive material, and the wider main body is filled with the second electrically conductive material. A layer of the first electrically conductive material which has filled the narrower protrusion functions as the first contact plug. The contact plug of different kinds of material can easily be formed according to a contact hole filling technique such as CVD or the like by adjusting the widths of the planar pattern and the film thicknesses of the thin films of the first and second electrically conductive materials. This is effective in mass-producing phase-change memory devices.

In the phase-change memory device, the planar shape of the contact plug of different kinds of material is either P-shaped, L-shaped, or T-shaped.

The P-shaped, L-shaped, or T-shaped planar shape of the contact plug of different kinds of material, or the contact hole defined in the interlayer insulating film which is filled with the different materials can be easily achieved by changing the shape of the mask used to form the contact hole. This is also effective in mass-producing phase-change memory devices.

In the phase-change memory device, the second electrically conductive material plug is greater in volume than the first electrically conductive material plug.

The first electrically conductive material plug is provided primarily for reducing the radiation of heat transferred from the heater electrode. The electrical resistance of the first electrically conductive material plug tends to increase slightly. However, if the volume of the second electrically conductive material plug having good conductivity is greater than the volume of the first electrically conductive material plug, then the electrical resistance of the contact plug of different kinds of material is governed by the second electrically conductive material plug. Therefore, the overall electrical resistance of the contact plug of different kinds of material can be sufficiently low, causing no circuit operation problems.

In the phase-change memory device, the first electrically conductive material of the first electrically conductive material plug includes a metal material which is a major constituent of the heater element, and the second electrically conductive material plug includes a metal material which is a major constituent of a ground potential electrode or an interconnect of the phase-change memory device.

The above paragraph indicates that the first electrically conductive material plug includes a metal material which is a major constituent of the heater element, i.e., the first electrically conductive material plug is made of the same metal material as the heater electrode, and the second electrically conductive material plug includes a metal material which is a major constituent of ground electrodes and ground interconnects which are required to have low resistance. Since special metal materials do not need to be used for heat radiation, no problems occur in manufacturing the phase-change memory device.

In the phase-change memory device, the first electrically conductive material of the first electrically conductive material plug includes a metal material which is the same as the metal material of the heater element, and the second electrically conductive material plug includes a metal material which is a major constituent of a ground potential electrode or an interconnect of the phase-change memory device.

The above paragraph indicates that the first electrically conductive material plug is made of the same metal material as the heater element, i.e., the first electrically conductive material plug is made of the same metal material as the heater electrode, and the second electrically conductive material plug is made of the same material as ground electrodes and ground interconnects which are required to have a low resistance, i.e., the second electrically conductive material plug is made of the same material as ground electrodes and ground interconnects. Since special metal materials do not need to be used for heat radiation, no problems occur in manufacturing the phase-change memory device.

In the phase-change memory device, the first electrically conductive material of the first electrically conductive material plug comprises a metal which is either titanium (Ti), tantalum (Ta), molybdenum (Mo), niobium (Nb), zirconium (Zr), or tungsten (W), or a nitride of the metal, or a silicide of the metal.

The above materials are metal materials that can be used as a major constituent of the first electrically conductive material plug. These metal materials can be used as the material of the heater electrode. Either one of the metal materials has electrical conductivity and thermal conductivity that are lower than aluminum (Al) or copper (Cu) that is used in silicon-based LSI circuits. However, these metal materials include materials that can be used as the material of the second electrically conductive material plug.

In the phase-change memory device, the first electrically conductive material of the first electrically conductive material plug comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

The above metal materials are metal materials that can be used as the material of the second electrically conductive material plug. These metal materials can basically be used as the material of the heater electrode. However, these metal materials include materials that can be used as the material of the second electrically conductive material plug.

In the phase-change memory device, the second electrically conductive material of the second electrically conductive material plug comprises a metal which is either tungsten (W), aluminum (Al), molybdenum (Mo), or copper (Cu), or a silicide of the metal.

The above metal materials are metal materials that can be used as the material of the second electrically conductive material plug. These metal materials can basically be used as the material of ground electrodes and ground interconnects. However, these metal materials include materials that can be used as the material of the first electrically conductive material plug.

In the phase-change memory device, the specific resistance of the first electrically conductive material of the first electrically conductive material plug is at least 10 times the specific resistance of the second electrically conductive material of the second electrically conductive material plug.

The above paragraph indicates the difference between the specific resistances of the materials of the first and second electrically conductive material plugs, i.e., the first and second electrically conductive materials. The electrical conductivities and thermal conductivities of the first and second electrically conductive materials should preferably, but not necessarily, be different from each other by about 10 times.

In the phase-change memory device, the first electrically conductive material plug comprises a plug formed by depositing titanium nitride (TiN) on a thin film of titanium (Ti) disposed on the inner and bottom surfaces of a contact hole defined in an interlayer insulating film, and the second electrically conductive material plug comprises a plug formed by depositing tungsten (W) in a cavity which remains after the titanium nitride (TiN) is deposited.

A narrow groove can be fully filled with a thin film having a certain thickness and a wide groove cannot be fully filled with such a thin film. Based on such a phenomenon, a narrow groove is fully filled with titanium nitride (TiN) as the first electrically conductive material, thereby forming the first electrically conductive material plug, i.e., the portion of the first electrically conductive material plug which contacts the heater electrode, and a wide groove with a cavity remaining therein is filled with tungsten (W) as the second electrically conductive material, thereby forming the second electrically conductive material plug. The contact plug of different kinds of material can be easily formed according to a contact hole filling technique such as CVD or the like by adjusting the widths of the planar pattern and the grooves of the contact hole and also by adjusting the film thicknesses of the thin films of the first and second electrically conductive materials. This is effective in mass-producing phase-change memory devices.

The phase-change memory device further includes a switching element for selecting a memory cell, and a ground potential connecting plug for connecting a ground potential to one pole of the switching element, the one pole of the switching element being connected to the ground potential through the ground potential connecting plug, and another pole of the switching element being electrically connected to the second electrically conductive material plug of the contact plug of different kinds of material.

The above paragraph indicates that one pole of a switching element, e.g., an insulated-gate field-effect transistor, a bipolar transistor, a PN junction diode, a Schoutky barrier diode, or the like, for selecting a memory cell is connected to the ground potential through the ground potential plug, and the other pole thereof is electrically connected to the heater electrode through the different-material contact hole. The "ground potential" is broadly interpreted to signify a potential for AC grounding, i.e., a DC reference potential.

In the phase-change memory device, the ground potential connecting plug comprises a first electrically conductive material plug and a second electrically conductive material plug as the contact plug of different kinds of material.

The ground potential plug and the contact plug of different kinds of material are identical in structure to each other so that they can be manufactured in a common manufacturing step.

According to another aspect of the present invention, a phase-change memory device includes a switching element for selecting a memory cell, the switching element being disposed in or on a semiconductor substrate, a contact plug of different kinds of material having a first electrically conductive material plug and a second electrically conductive material plug whose electrical conductivity and thermal conductivity is greater than that of the first electrically conductive material plug, the first electrically conductive material plug and the second electrically conductive material plug being held in contact with each other through at least respective side surfaces thereof, a heater electrode connected to the first electrically conductive material plug, the heater electrode and the second electrically conductive material plug being not in overlapping relation to each other, a phase-change layer connected to the heater electrode, and an electrode layer connected to the phase-change layer.

The phase-change memory device (phase-change memory IC) which is of a basic overall structure as described above is produced by successively forming a switching element, a contact plug of different kinds of material, a heater electrode, a phase-change layer, and an electrode terminal according to the semiconductor fabrication process.

In the phase-change memory device, the phase-change layer comprises a chalcogenide semiconductor layer. Specifically, a thin semiconductor film including chalcogenide is used as the phase-change layer.

According to still another aspect of the present invention, there is also provided a method of manufacturing a contact plug of different kinds of material of a phase-change memory device as described above, comprising the steps of selectively patterning a portion of an interlayer insulating film disposed on a semiconductor substrate to form a contact hole having a planar shape including a wider main body and a protrusion projecting from the main body and narrower than the main body, filling the contact hole with the first electrically conductive material to form the first electrically conductive material plug under such a condition that only the protrusion is fully filled, and fully filling the main body of the contact hole with the second electrically conductive material to form the second electrically conductive material plug.

A narrow groove can be fully filled with a thin film having a certain thickness and a wide groove cannot be fully filled with such a thin film. Based on such a phenomenon, a contact hole has a planar shape having a main body and a protrusion, and a narrow groove is fully filled with the first electrically conductive material, thereby forming the first electrically conductive material plug, and a wide groove with a cavity remaining therein is filled with the second electrically conductive material, thereby forming the second electrically conductive material plug. The contact plug of different kinds of material can easily be formed according to a contact hole filling technique such as CVD or the like by adjusting the widths of the planar pattern of the grooves (contact hole) and the grooves and also by adjusting the film thicknesses of the thin films of the first and second electrically conductive materials.

According to yet another aspect of the present invention, there is also provided a method of manufacturing a phase-change memory device, comprising the steps of forming a switching element for selecting a memory cell, in or on a semiconductor substrate, forming the contact plug of different kinds of material such that the second electrically conductive material plug is held in electrical contact with one pole of the switching element, forming the heater electrode such that the heater electrode has a lower surface held in contact with an upper surface of the first electrically conductive material plug, forming the phase-change layer such that the phase-change layer has a lower surface held in contact with an upper surface of the heater electrode, and forming an electrode layer connected to at least a portion of an upper surface of the phase-change layer.

The phase-change memory device (phase-change memory IC) is manufactured by successively forming a switching element, a contact plug of different kinds of material, a heater electrode, a phase-change layer, and an electrode terminal according to the semiconductor fabrication process. The contact plug of different kinds of material is manufactured by the method of generating a contact plug of different kinds of material referred to above. According to the above manufacturing method, it is possible to manufacture a large-scale phase-change memory device while satisfying contradictory requirements for reduced heat radiation and reduced electric resistance using the general fabrication technology, i.e., without special fabrication processes.

In the above method of manufacturing a phase-change memory device, the above step of forming the contact plug of different kinds of material includes the step of forming a ground potential plug for keeping another pole of the switching element at a ground potential when the contact plug of different kinds of material is formed.

The contact plug of different kinds of material and the ground potential plug can be simultaneously produced by a common fabrication process. Therefore, the number of fabrication steps can be reduced.

In the above method of manufacturing a phase-change memory device, the switching element comprises an insulated-gate field-effect transistor, and when a gate electrode of the insulated-gate field-effect transistor is formed, an electrically insulating layer is formed on the upper and side surfaces of an electrically conductive material layer of the gate electrode.

With the phase-change memory device according to the present invention, since the contact plug of different kinds of material is disposed close to an insulated-gate field-effect transistor (MOS transistor) for selecting a memory cell, if the phase-change memory device is highly integrated, then a short circuit may possibly occur between the contact plug of different kinds of material and the gate electrode of the MOS transistor. To avoid such a short circuit, the upper and side surfaces of the electrically conductive material layer (doped polysilicon layer or the like) of the gate electrode are covered with an insulating film. The side surface of the electrically conductive material layer of the gate electrode may be covered with a side wall in the form of an insulating film according to CVD, for example. When the gate electrode is formed, a nitride film may be deposited on the supper surface of the electrically conductive material layer and then patterned, thereby covering the supper surface of the electrically conductive material layer.

BRIEF DESCRIPTION OF THE DRAWINGS

FIG. 1 is a diagram showing a portion of the periodic table which is illustrative of chalcogen elements;

DESCRIPTION OF THE EXEMPLARY EMBODIMENTS

First Embodiment

In the description which follows, the term "contact plug" refers to an electrode used to electrically connect an electronic circuit element and another electronic circuit element to each other, and is generally formed by being embedded in an electrical insulation film.

The term "contact plug of different kinds of material" refers to a composite contact plug made of at least two electrically conductive material layers (electrically conductive plugs) held in contact with each other through surfaces thereof.

One conventional contact plug is of a structure which is formed by depositing a thin metal barrier, e.g., an auxiliary titanium layer to provide a good electrical connection with a lower silicon substrate, and thereafter embedding a metal having a small specific resistance, e.g., tungsten, in an insulating film. The conventional contact plug of this structure does not correspond to the "contact plug of different kinds of material" according to the present invention. The reason is that the portion of the conventional contact plug which positively functions as an electrode for interconnecting the electronic circuit components, i.e., the portion providing a current path, is made up of only the metal having a small specific resistance, e.g., tungsten, and the metal barrier is provided only for the purpose of manufacturing semiconductor devices better.

The "contact plug of different kinds of material" according to the present invention includes at least two portions which positively function as electrodes for interconnecting the electronic circuit components, i.e., portions functioning as contact plugs, the two contact plugs being made of different electrically conductive materials and integrally combined into a composite contact plug.

The electrically conductive materials of the "contact plug of different kinds of material" according to the present invention may also function as the metal barrier referred to above.

The "contact plug of different kinds of material" according to the present invention is used to electrically interconnect a heater electrode and an electrically conductive layer, i.e., a diffused layer, a metal electrode, an interconnect, or another contact plug on the silicon substrate.

Specific details of a phase-change memory device according to the first embodiment will be described below.

Figure 7A:
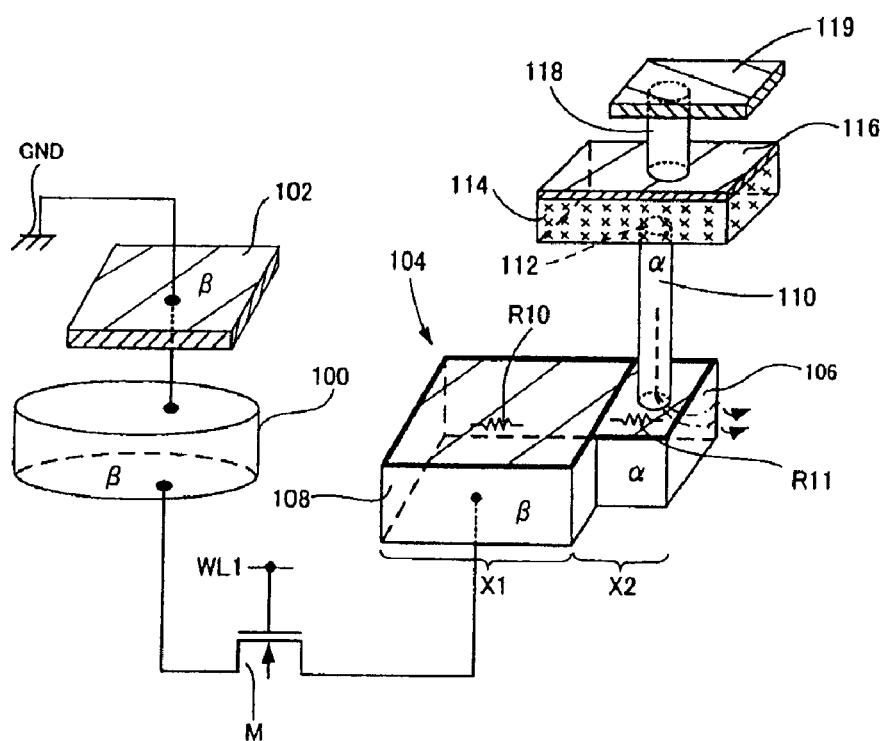
FIG. 7A is a view showing an essential structure of a phase-change memory device according to the present invention.
Figure 7B:
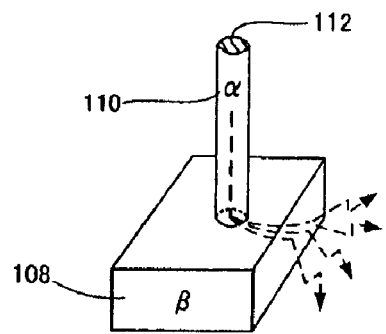
FIG. 7B is a view showing a conventional structure by which a heater electrode and a contact plug are connected to each other, as a comparative example.

FIGS. 7A and 7B show a characteristic structure of a phase-change memory device according to the present invention. FIG. 7A shows an essential structure of the phase-change memory device according to the present invention, and FIG. 7B shows a conventional structure by which a heater electrode and a contact plug are connected to each other, as a comparative example.

As shown in FIG. 7A, an NMOS transistor, i.e., an N-channel insulated-gate field effect transistor, M is a switching element for selecting a memory cell, and has a gate connected to word line WL1.

The source of NMOS transistor M is connected to ground potential metal plug 100 made of material β and also to ground potential (reference potential) GND through ground potential interconnect 102 which is a ground interconnect made of material β.

The drain of NMOS transistor M is electrically connected to second electrically conductive material plug 108 of contact plug of different kinds of material 104.

Contact plug of different kinds of material 104 comprises first electrically conductive material plug 106 made of first electrically conductive material α and second electrically conductive material plug 108 made of second electrically conductive material β. Plugs 106, 108 are held in contact with each other through at least respective side surfaces thereof, resulting in electrical conduction between plugs 106, 108. First electrically conductive material plug 106 has specific resistance R11, and second electrically conductive material plug 108 has specific resistance R10. Specific resistances R11, R10 are related to each other such that R11>R10.

The specific resistance (ρ) is also called electric resistivity or volume resistivity, and the reciprocal (1/ρ) thereof is referred to as electrical conductivity which is also referred to as specific electrical conductivity. According to the present invention, the terms "specific resistance" and "electrical conductivity" will be used. A metal material which allows an electric current to flow easily therethrough also allows heat to be transferred easily therethrough. Therefore, a material having a larger specific resistance has smaller electrical conductivity and a smaller thermal conductivity. First electrically conductive material α and second electrically conductive material β are related to each other such that α<β with respect to their electrical conductivity and thermal conductivity.

Heater electrode 110, which is a lower electrode made of material α a has a bottom surface held in contact with the upper surface of first electrically conductive material plug 106.

Heater electrode 110 has an upper surface held in contact with the bottom surface of phase-change layer 114 made of GST. An area near contact surface 112 across which heater electrode 110 and phase-change layer 114 contact each other serves as a phase-change area where a phase change occurs.

Upper electrode 116 serving as an electrode layer is disposed on the upper surface of phase-change layer 114. Upper electrode 116 is connected to electrode terminal 119 through contact plug 118.

The phase-change memory device according to the first embodiment which is of the above structure has an improved thermal efficiency when data is written in the phase-change memory device, i.e., when the phase-change memory device is reset, and has a circuit of low resistance. These advantages are provided by contact plug of different kinds of material 104.

Preferred aspects of contact plug of different kinds of material 104 and their features are listed as follows:

(1) Contact plug of different kinds of material 104 is made up of first electrically conductive material plug 106 and second electrically conductive material plug 108. First electrically conductive material α of first electrically conductive material plug 106 and second electrically conductive material β of second electrically conductive material plug 108 are related to each other such that α>β with respect to specific resistance and α<β with respect to the electrical conductivity and thermal conductivity.

For example, if titanium (Ti: electrical conductivity of $2.34 \times 10^6/\Omega \cdot m$ and thermal conductivity of 21.9 W/m·K) is used as first electrically conductive material α, then tungsten (W: electrical conductivity of $18.9 \times 10^6/\Omega \cdot m$ and thermal conductivity of 17.4 W/m·K) whose electrical conductivity and thermal conductivity are greater than titanium is used as second electrically conductive material β.

In (2) and (3) below, specific materials that can be used as the first and second electrically conductive materials will be enumerated. Some metal materials, e.g., tungsten and molybdenum, are listed in both (2) and (3). Stated otherwise, tungsten and molybdenum may be used as both the first and second electrically conductive materials. The present invention does not reside in materials themselves, but combinations thereof. It is important according to the present invention that the relationship α>β be satisfied with respect to specific resistance and the relationship α<β be satisfied with respect to electrical conductivity and thermal conductivity.

(2) First electrically conductive material plug 106 is made of first electrically conductive material α, e.g., titanium nitride (TiN), that is selected from the standpoint of attaching more importance to thermal conductivity than to electrical conductivity and reducing thermal conductivity. First electrically conductive material α should preferably be the same material as heater electrode 110 or a material similar to heater electrode 110, i.e., a material whose major constituent is the same as that of heater electrode 110.

Specifically, first electrically conductive material α may be a material containing any one of the metals including titanium (Ti), tantalum (Ta), molybdenum (Mo), niobium (Nb), zirconium (Zr) or tungsten (W), or a nitride of any one of the metals, or a silicide of any one of the metals. More specifically, first electrically conductive material α may be a material including titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi) or molybdenum silicide (MoSi).

(3) Second electrically conductive material plug 108 is made of second electrically conductive material β, e.g., tungsten (W), that is selected from the standpoint of attaching more importance to electrical conductivity than to thermal conductivity and reducing the circuit resistance.

Second electrically conductive material β should preferably be the same material as ground potential plug 100 and ground potential interconnect 102 which needs to be low in resistance, or a material similar to ground potential plug 100 and ground potential interconnect 102, i.e., a material whose major constituent is the same as that of ground potential plug 100 and ground potential interconnect 102. Specifically, second electrically conductive material β may be any one of metals including tungsten (W), aluminum (Al), molybdenum (Mo) or copper (Cu), or a silicide of any one of the metals.

(4) The electrical conductivity and the thermal conductivity of the major metal materials of first and second electrically conductive materials α, β should preferably, but not necessarily, be of approximate numerical values as follows:

The major metal material (first electrically conductive material α) of first electrically conductive material plug 106 should preferably have an electrical conductivity of the order of $1.0 \times 10^6/\Omega \cdot m$ and a thermal conductivity of the order of 10.0 W/m·K, and the major metal material (second electrically conductive material β) of second electrically conductive material plug 108 should preferably have an electrical conductivity of the order of $10.0\times10^6/\Omega\cdot$m and a thermal conductivity of the order of 100.0 W/m·K. It is desirable that the electrical conductivity and the thermal conductivity of first electrically conductive material α be different from the electrical conductivity and the thermal conductivity of second electrically conductive material β by about 10 times, preferably more than 10 times.

The electrical conductivities and thermal conductivities of metal materials which can be candidates for the major constituents of first and second electrically conductive materials α, β are as follows: The electrical conductivity is indicated by C, and the thermal conductivity by P.

(Candidates for the Major Constituent of First Electrically Conductive Material α)

Ti (titanium): C=$2.34\times10^6/\Omega\cdot$m, P=21.9 W/m·K
Nb (niobium): C=$6.93\times10^6/\Omega\cdot$m, P=53.7 W/m·K
Ta (tantalum): C=$7.61\times10^6/\Omega\cdot$m, P=57.5 W/m·K
Zr (zirconium): C=$2.36\times10^6/\Omega\cdot$m, P=22.7 W/m·K
TiN (titanium nitride): Since a nitride of a metal has properties taken over from the metal, TiN is considered to have properties similar to Ti.

(Candidates for the Major Constituent of Second Electrically Conductive Material β)

Al (aluminum): C=$37.7\times10^6/\Omega\cdot$m, P=237 W/m·K
Mo (molybdenum): C=$18.7\times10^6/\Omega\cdot$m, P=138 W/m·K
Cu (copper): C=$59.6\times10^6/\Omega\cdot$m, P=401 W/m·K
W (tungsten): C=$18.9\times10^6/\Omega\cdot$m, P=174 W/m·K It can be seen from the numerical values of the electrical conductivities (and thin-film specific resistances) and the thermal conductivities of the metal materials that the metal material which can be the major constituent of first electrically conductive material α has an electrical conductivity of the order of $1.0\times10^6/\Omega\cdot$m and a thermal conductivity of the order of 10.0 W/m·K, the metal material which can be the major constituent of second electrically conductive material β has an electrical conductivity of the order of $10.0\times10^6/\Omega\cdot$m and a thermal conductivity of the order of 100.0 W/m·K, and the electrical conductivity and the thermal conductivity of first electrically conductive material α can be different from the electrical conductivity and the thermal conductivity of second electrically conductive material β by about 10 times.

(5) Examples of preferred electrically conductive materials are titanium nitride (TiN) and tungsten (W). Specifically, a thin film of titanium nitride (TiN) may be used as first electrically conductive material α and a thin film of tungsten (W) may be used as second electrically conductive material β. The specific resistances of a thin film of titanium nitride (TiN) and a thin film of tungsten (W) will be compared with each other below.

If a thin film of metal nitride is formed by CVD, then the specific resistance of the thin film varies depending on the raw material gas, and the range in which the specific resistance of the thin film varies also differs depending on the raw material gas. According to an experiment conducted by the inventor of the present invention, if TiC14 is used as the raw material gas, then the specific resistance of the thin film of TiN can vary in the range from $500\times10^{-8}/\Omega\cdot$m to $900\times10^{-8}/\Omega\cdot$m. According to the MOCVD process, i.e., if Ti[N(C$_2$H$_5$)$_2$]$_4$ is used as the raw material gas, then the specific resistance of the thin film of TiN can vary in the range from $1000\times10^{-8}/\Omega\cdot$m to $600\times10^{-8}/\Omega\cdot$m. In either case, the specific resistance of the thin film of TiN is considerably large.

The inventor of the present invention produced a thin film of tungsten (W) according to the CVD process, and measured the specific resistance of the thin film. The measured specific resistance of the thin film was $10\times10^{-8}/\Omega\cdot$m. It is understood that the specific resistance of the thin film of tungsten is less than 1/10 of the specific resistance of the thin film of TiN.

(6) The volume of second electrically conductive material plug 108 should preferably be greater than the volume of first electrically conductive material plug 106. Specifically, first electrically conductive material plug 106 is provided primarily for reducing the radiation of heat transferred from heater electrode 110. The electrical resistance of first electrically conductive material plug 106 tends to increase slightly. However, if the volume of second electrically conductive material plug 108 which is made of a good conductor is greater than the volume of first electrically conductive material plug 106, then the electrical resistance of contact plug of different kinds of material 104 is governed by second electrically conductive material plug 108. Therefore, the overall electrical resistance of contact plug of different kinds of material 104 can be sufficiently low, causing no circuit operation problems.

(7) First electrically conductive material plug 106 and second electrically conductive material plug 108 are held in contact with each other through at least respective side surfaces thereof. Heater electrode 110 and second electrically conductive material plug 108 do not overlap each other. Stated otherwise, second electrically conductive material plug 108 is not present directly below heater electrode 110. The phrase "first and second electrically conductive material plugs 106, 108 contact each other through at least respective side surfaces thereof" means that first and second electrically conductive material plugs 106, 108 may contact each other through any surfaces thereof, but such surfaces should necessarily include side surfaces thereof.

(8) Contact plug of different kinds of material 104 comprises main body X1 which is mainly composed of second electrically conductive material plug 108 and protrusion X2 which is mainly composed of first electrically conductive material plug 106, protrusion X2 projecting from main body X1. The planar shape, including main body X1 and protrusion X2, of contact plug of different kinds of material 104 is selected for the benefit of the process of manufacturing contact plug of different kinds of material 104. Specifically, a contact hole formed in an interlayer insulating film has a planar shape including a wider main body and a narrower protrusion. When a thin film of first electrically conductive material is formed on the interlayer insulating film, the narrower protrusion is fully filled with first electrically conductive material to produce protrusion X2, and the wider main body is not fully filled with first electrically conductive material, leaving a large cavity. The large cavity is then fully filled with a thin film of second electrically conductive material to produce main body X1. In this manner, contact plug of different kinds of material 104 is manufactured with ease. The manufacture of contact plug of different kinds of material 104 will be described later with reference to FIGS. 8 through 10D.

Second Embodiment

In a second embodiment, the planar shape of a contact plug of different kinds of material, examples of materials used, and a method of manufacturing a contact plug of different kinds of material (and a ground potential plug) will be described below with reference to FIGS. 8 through 10D.

Figure 8:
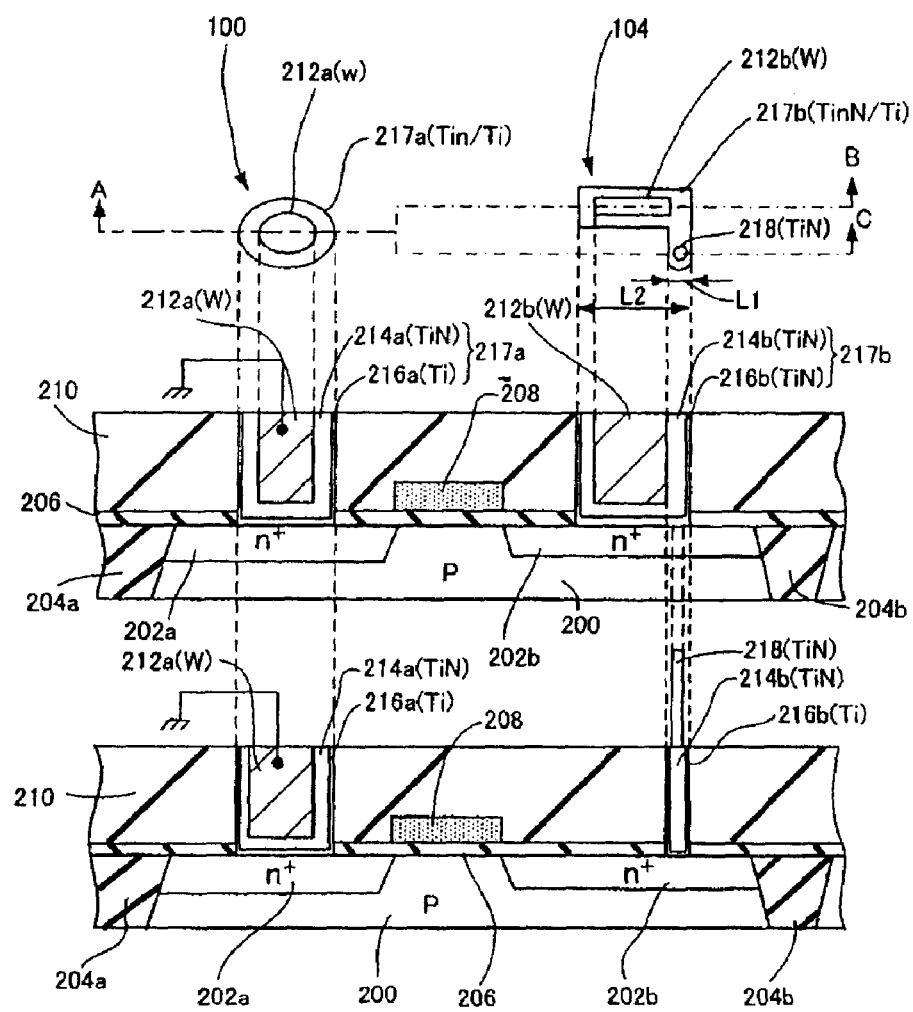
FIG. 8 is a view showing planar configurations of a contact plug of different kinds of material and a ground potential plug and an essential cross-sectional structure of a phase-change memory device with those plugs.

FIG. 8 shows planar configurations of a contact plug of different kinds of material and a ground potential plug and an essential cross-sectional structure of a phase-change memory device with those plugs. In FIG. 8, an upper section shows planar configurations of a contact plug of different kinds of material and a ground potential plug, a middle section shows a cross section of the device taken along line A-B of the upper section, and a lower section shows a cross section of the device taken along line A-C of the upper section.

Ground potential plug 100 and contact plug of different kinds of material 104 comprise respective TiN/Ti films 217a, 217b each having a lower thin titanium film and a titanium nitride film disposed thereon, made of a first electrically conductive material, i.e., a material selected for thermal conductivity, and respective W (tungsten) films 212a, 212b made of a second electrically conductive material, i.e., a material selected for electrical conductivity.

In the upper section of FIG. 8, TiN/Ti films 217a, 217b are regarded as single films. In the middle and lower sections of FIG. 8, TiN/Ti films 217a, 217b are shown as including respective titanium (Ti) films 216a, 216b and respective titanium nitride (TiN) films 214a, 214b. Thin titanium (Ti) films 216a, 216b serve as films for keeping TiN/Ti films 217a, 217b in good electrical contact with lower silicon substrate 200 because they cause a silicide reaction with silicon substrate 200 to provide a good ohmic contact. Therefore, titanium (Ti) films 216a, 216b are not essential films of TiN/Ti films 217a, 217b. Rather, titanium nitride (TiN) films 214a, 214b provide an essential function as the first electrically conductive material.

As can be seen from the upper section of FIG. 8, ground potential plug 100 is of a circular (elliptical) shape. Ground potential plug 100 is formed by filling a peripheral portion of a contact hole in interlayer insulating film 210 with TiN/Ti film 217a including lower thin titanium film 216a and titanium nitride film 214a thereon, and filling a central portion of the contact hole with W (tungsten) film 212a.

As shown in FIG. 7A, contact plug of different kinds of material 104 is of an L shape provided by a combination of the main body and the protrusion. Specific examples of the planar configuration of contact plug of different kinds of material 104 will be described later with reference to FIGS. 10A through 10D.

Contact plug of different kinds of material 104 is formed by filling a narrower portion of a contact hole in interlayer insulating film 210 with TiN/Ti film 217b including lower thin titanium film 216b and titanium nitride film 214b thereon, and filling a wider central portion of the contact hole with W (tungsten) film 212b. The protrusion, which is part of the filled narrower portion of the contact hole, has width L1, and the main body, which includes the filled wider central portion of the contact hole, has width L2. Heater electrode 218 made of titanium nitride (TiN) is connected to the protrusion near its distal end.

As can be seen from the middle section of FIG. 8, p-type semiconductor substrate 200 includes a field region surrounded by STIs (Shallow Trench Isolations) 204a, 204b and having an NMOS transistor disposed therein. The NMOS transistor comprises n-type diffused layers (a source layer and a drain layer) 202a, 202b, gate insulating film 206, and gate electrode (doped polysilicon layer) 208. Interlayer insulating film 210 has contact holes defined therein which are filled successively with Ti, TiN, and W to provide ground potential plug 100 and contact plug of different kinds of material 104.

As can be seen from the lower section of FIG. 8, the protrusion of contact plug of different kinds of material 104 comprises titanium (Ti) film 216b and titanium nitride (TiN) film 214b which fully fill the corresponding contact hole in interlayer insulating film 210. Heater electrode 218 made of TiN is held in contact with the protrusion.

A method of manufacturing an essential structure of the phase-change memory device shown in FIG. 8.

FIGS. 9A through 9D are cross-sectional views of a device at each of major processing steps, illustrating a method of manufacturing an essential structure of the phase-change memory device shown in FIG. 8. The cross-sectional views of FIGS. 9A through 9D are taken along line A-C of FIG. 8.

Figure 9A:
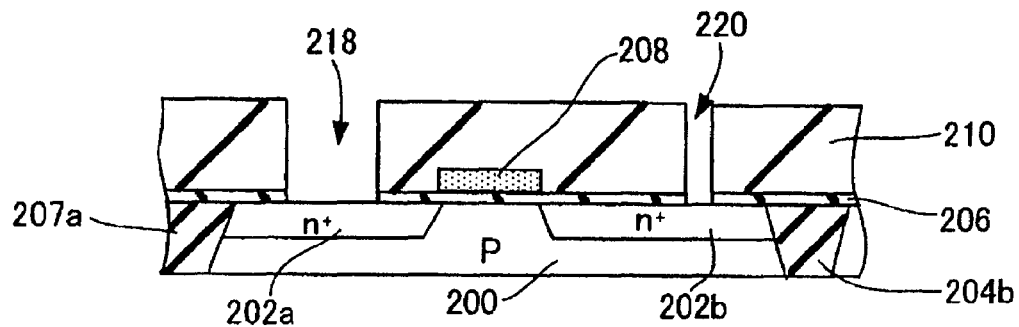
FIGS. 9A through 9D are cross-sectional views of a device at each of the major processing steps, illustrating a method of manufacturing an essential structure of the phase-change memory device shown in FIG. 8.

As shown in FIG. 9A, STIs (Shallow Trench Isolations) 204a, 204b are formed in p-type semiconductor substrate 200. A device forming region (field region) is surrounded by STIs 204a, 204b. Then, gate insulating film 206 is deposited to a thickness of 7 nm, for example, on the surface of semiconductor substrate 200. Then, a film of doped silicon and a film of tungsten silicide are successively deposited, each having a thicknesses of 100 nm, after which a photolithographic mask is formed. Then, the film of doped silicon and the film of tungsten silicide are etched by anisotropic etching, forming gate electrode 208. Then, using gate electrode 208 as a mask, phosphorus (P) ions are introduced into semiconductor substrate 200. The assembly is then heated to form n-type diffused layers (source and drain layers) 202a, 202b. Then, interlayer insulating film 210 in the form of TEOS oxide film is deposited to a thickness of 700 nm, after which the assembly is planarized by CMP (Chemical Mechanical Polishing).

Interlayer insulating film 210 is patterned to form contact hole (opening) 218 having a circular planar shape and a width of 200 nm, for example, for forming ground potential plug 100, and contact hole 220 having an L-shaped planar shape (see FIG. 8, the upper section on the right) for forming contact plug of different kinds of material 104. In FIG. 9A, reference numeral 220 denotes a narrow groove of the contact hole which corresponds to the protrusion. The width of groove 220 has a width of 100 nm, for example.

Figure 9B:
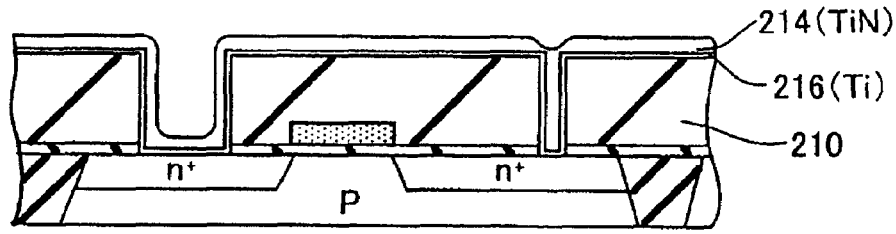

Then, as shown in FIG. 9B, Ti film 216 is deposited to a thickness of 15 nm and TiN film 214 is deposited to a thickness of 50 nm. At this time, the narrower groove is fully filled with a TiN/Ti film. In wider contact hole 218, only the bottom and side surfaces are covered with a TiN/Ti film. Although not shown, in the portion of contact hole 220 which corresponds to the main body of contact plug of different kinds of material 104, only the bottom and side surfaces are covered with a TiN/Ti film.

Figure 9C:
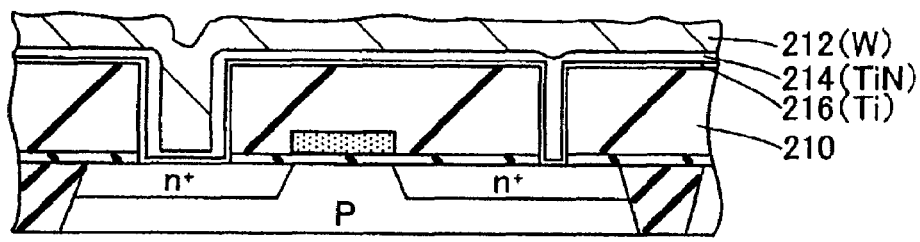
Figure 9D:
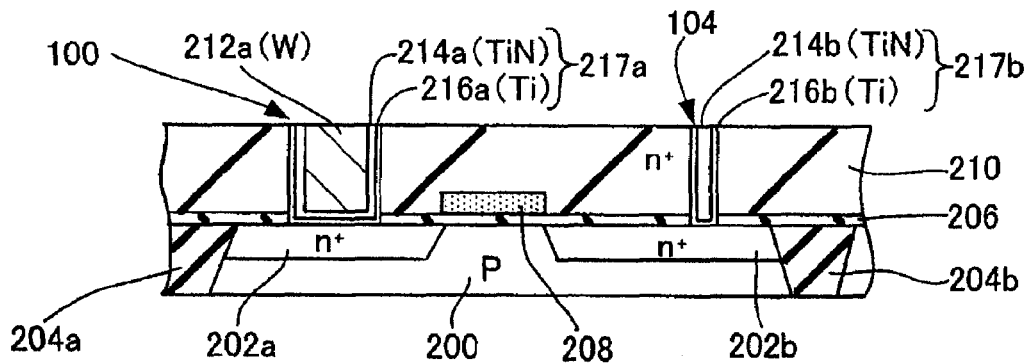

Then, as shown in FIG. 9C, a layer of tungsten (W) is deposited to a thickness of about 250 nm on the surface formed so far. Thereafter, as shown in FIG. 9D, the deposited layer of tungsten (W) and TiN/Ti films 214, 216 are continuously planarized by CMP, thereby forming ground potential plug 100 and contact plug of different kinds of material 104. In FIG. 9D, films 214a, 214b are collectively denoted by 217a, and films 214b, 216b by 217b.

Specific examples of the planar configuration of the contact plug of different kinds of material will be described later with reference to FIGS. 10A through 10D.

Figure 10A:
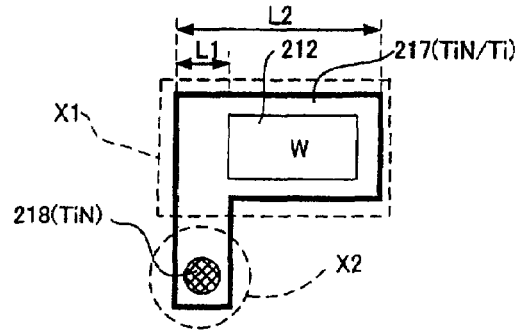
FIGS. 10A through 10D are views showing planar configurations of contact plug of different kinds of materials.
Figure 10B:
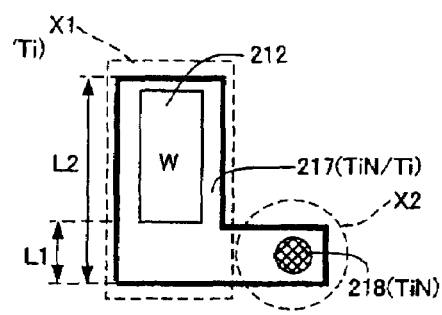
Figure 10C:
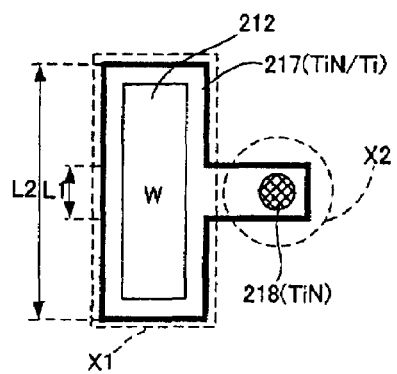
Figure 10D:
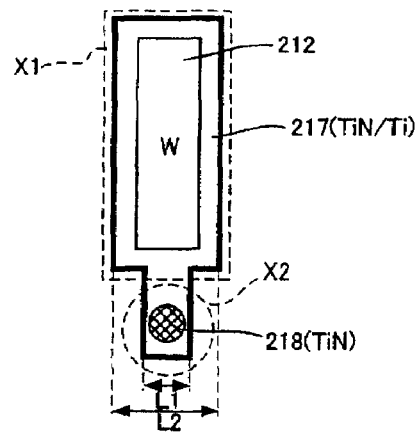

FIGS. 10A through 10D show planar configurations of contact plug of different kinds of materials. FIG. 10A shows a P-shaped contact plug of different kinds of material. FIG. 10B shows an L-shaped contact plug of different kinds of material. FIG. 10C shows a first protrusion type (T-shaped) contact plug. FIG. 10D shows a second protrusion type (I-shaped) contact plug.

As shown in FIGS. 10A through 10D, each of the contact plug of different kinds of materials comprises main body X1 and protrusion X2. Main body X1 has width L2 and protrusion X2 has width L1, which is sufficiently smaller than width L2.

In FIGS. 10A through 10D, a portion filled with TiN/Ti film 217 serves as the first electrically conductive material plug, and a portion filled with tungsten (W) film 212 as the second electrically conductive material plug. Thus, the contact plug of different kinds of material is a composite contact plug comprising first and second electrically conductive material plugs held in contact with each other through surfaces thereof.

Third Embodiment

In a third embodiment, the circuit arrangement of a phase-change memory device (phase-change memory IC), a layout of memory cells, a specific cross-sectional structure of a memory cell assembly, and a method of manufacturing the same will be described below.

Figure 11:
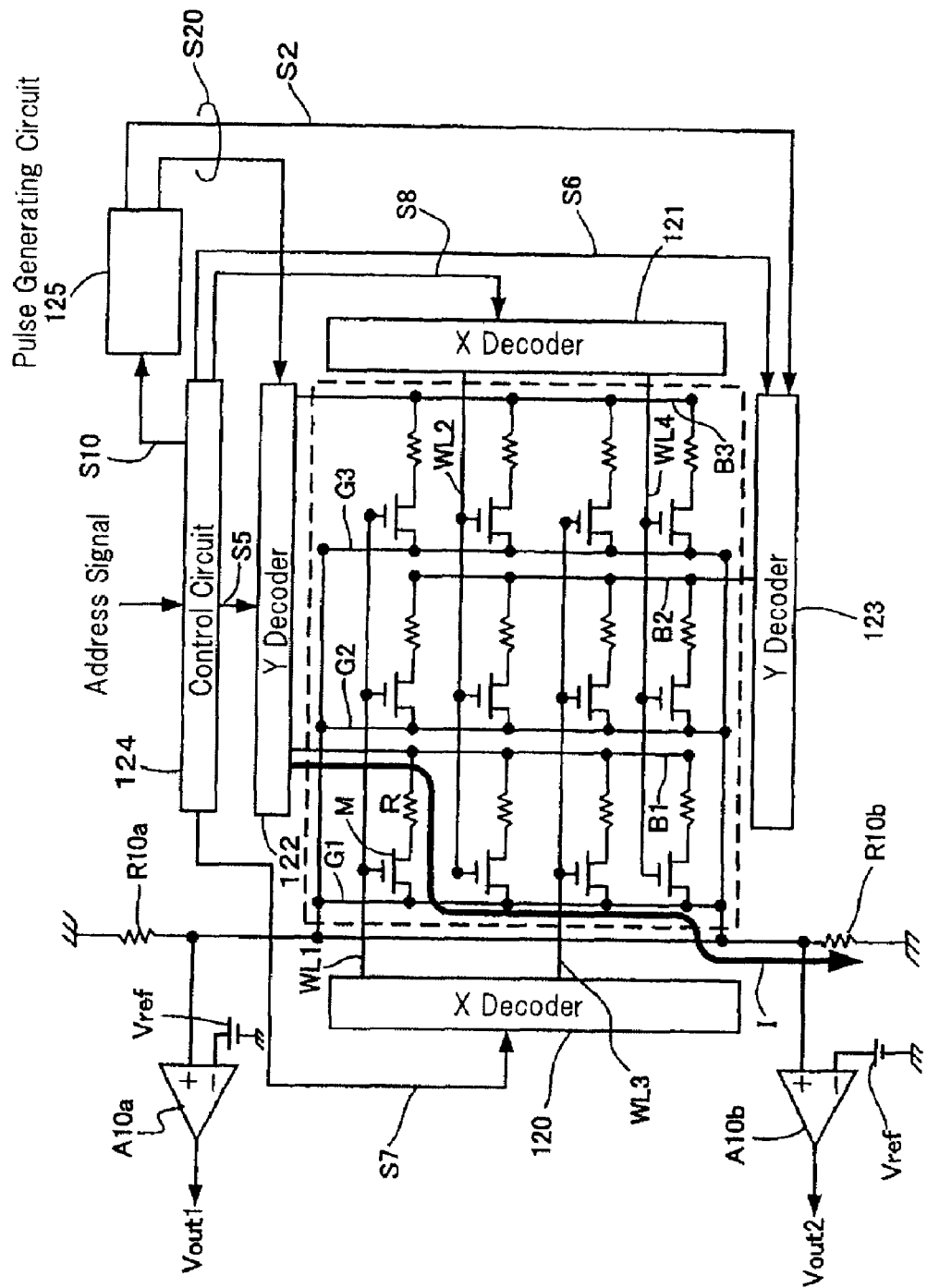
FIG. 11 is a circuit diagram showing an overall circuit arrangement of a phase-change memory device (phase-change memory IC) according to the present invention.

FIG. 11 is a circuit diagram showing an overall circuit arrangement of a phase-change memory device (phase-change memory IC) according to the present invention.

As shown in FIG. 11, a phase-change memory IC has a memory cell assembly disposed in a central area thereof. The memory cell assembly has a matrix of memory cells each comprising a MOS transistor M for selecting element and a phase-change memory device (represented as equivalent resistor R) according to the present invention.

The phase-change memory IC also has ground lines G1 through G3, word lines WL1 through WL4, and bit lines B1 through B3.

X decoders 120, 121 and Y decoders 122, 123 jointly make up an addressing circuit. X decoders 120, 121 energize word lines WL1 through WL4, and Y decoders 122, 123 energize bit lines B1 through B3.

Control circuit 124 generally controls operation of the phase-change memory IC. Control circuit 124 supplies control signals S5 through S8 respectively to X decoders 120, 121 and Y decoders 122, 123 in order to individually control the operation of X decoders 120, 121 and Y decoders 122, 123.

Pulse generating circuit 125 generates various pulse signals (setting, resetting, and reading pulse signals) S20 based on control signal S10 from control circuit 124, and supplies generated pulse signals S20 to Y decoders 122, 123.

The phase-change memory IC also has operational amplifiers A10a, A10b as sense amplifiers, and current-to-voltage converting resistors R10a, R10b for converting current I (indicated by the thick solid line in FIG. 11) into a voltage. A reference voltage Vref is applied to operational amplifiers A10a, A10b, which output respective detected signals Vout1, Vout2 of the phase-change memory IC.

Figure 12:
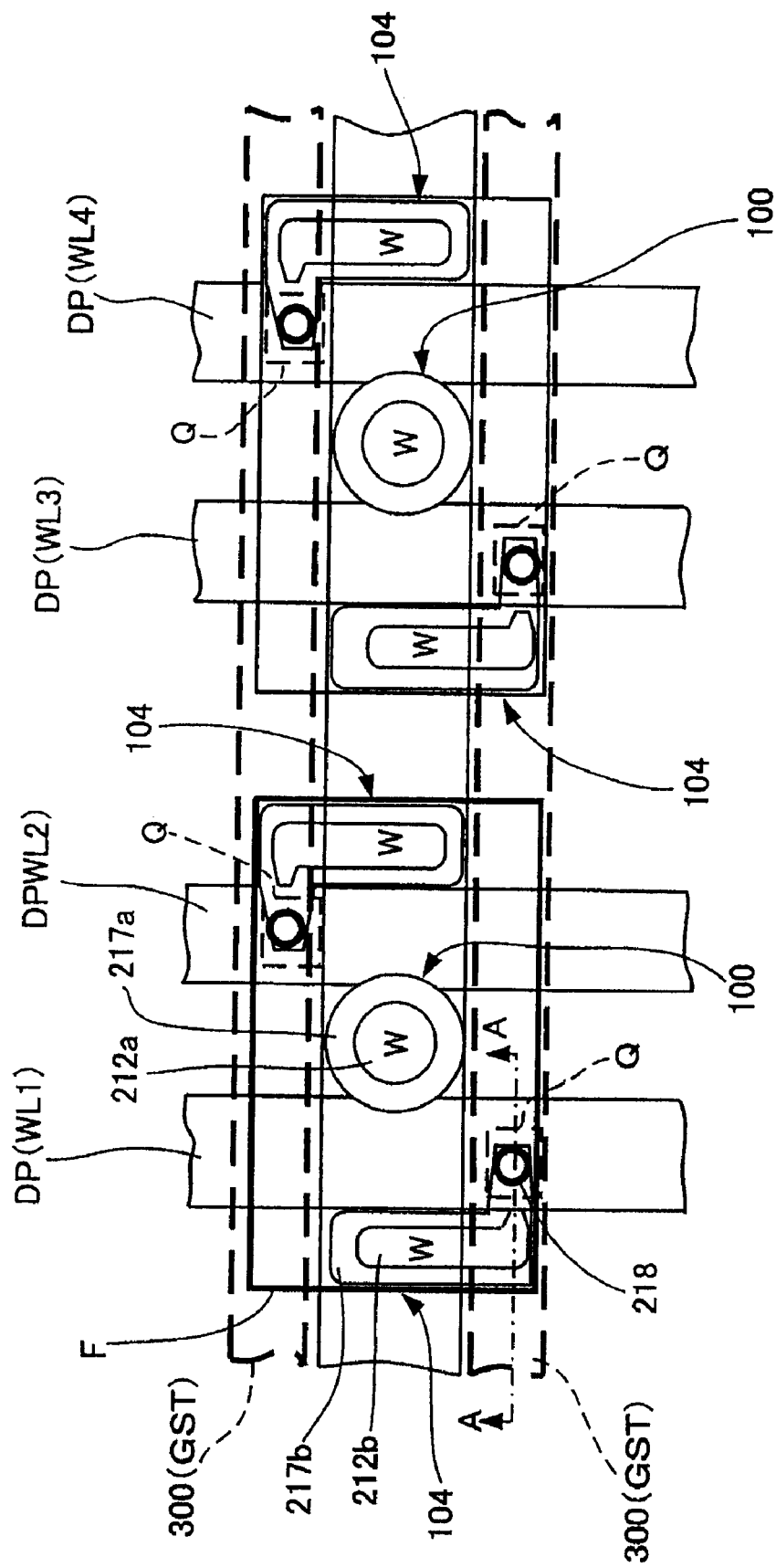
FIG. 12 a plan view showing by way of example a layout of elements and interconnects in a memory cell area of the phase-change memory device (phase-change memory IC) shown in FIG. 11.

FIG. 12 is a plan view showing by way of example a layout of elements and interconnects in a memory cell area of the phase-change memory IC shown in FIG. 11. Those parts in FIG. 12 which are identical to those shown in FIGS. 9A through 9D are denoted by identical reference characters.

In FIG. 12, ground potential plug 100 comprises first electrically conductive material plug 217a of TiN/Ti and second electrically conductive material plug 212a of tungsten (W).

Contact plug of different kinds of material 104 comprises first electrically conductive material plug 217b of TiN/Ti and second electrically conductive material plug 212b of tungsten (W). Contact plug of different kinds of material 104 has an L-shaped planar shape (see FIG. 10B).

In FIG. 12, region F surrounded by the thick solid line is a field region (device forming region). Four vertical interconnects DP extend through the memory cell area. These vertical interconnects DP comprise respective doped silicon layers serving as respective word lines WL1 through WL4 and doubling as the gate electrodes of MOS transistors.

GST films 300 serving as phase-change layers extend horizontally through the memory cell area. Heater electrodes 218 are connected to GST films 300 in joint regions Q which are free of an insulating film.

Figure 13:
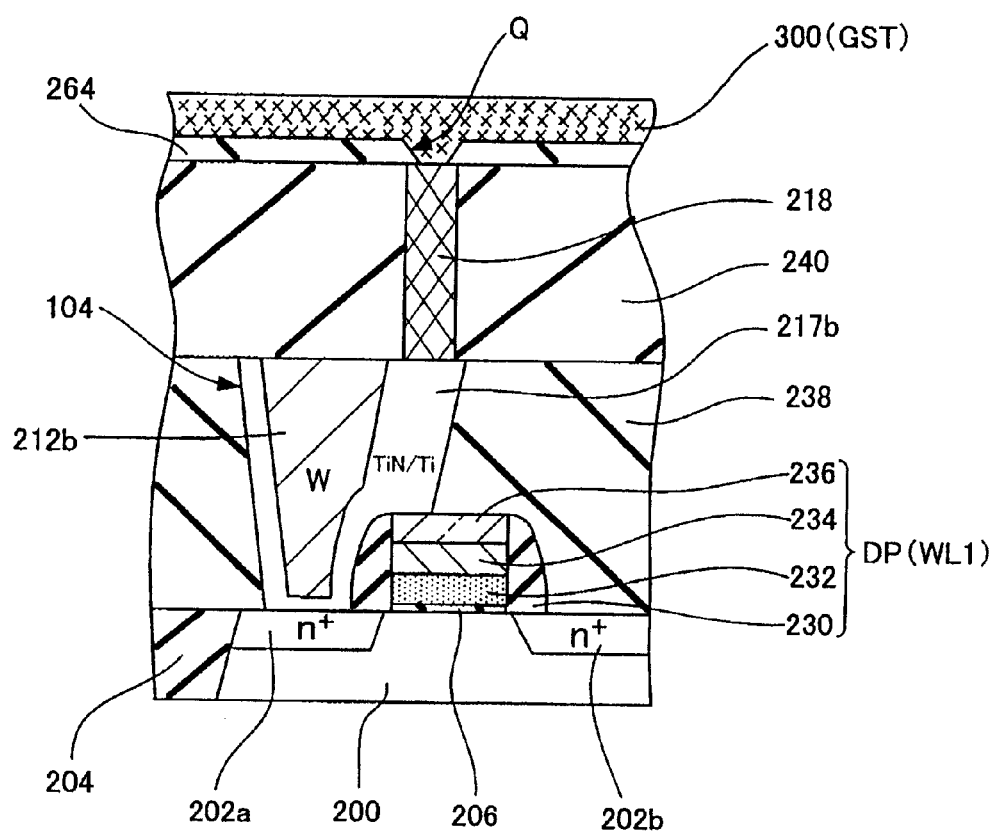
FIG. 13 is a cross-sectional view of the device taken along line A-A of FIG. 12.

FIG. 13 is a cross-sectional view of the device taken along line A-A of FIG. 12. Those parts in FIG. 13 which are identical to those shown in FIGS. 9A through 9D are denoted by identical reference characters.

The device structure shown in FIG. 13 is basically the same as the structure of the contact plug of different kinds of material shown in FIGS. 8, 9A through 9D.

Specifically, contact plug of different kinds of material 104 comprises second electrically conductive material plug 212b made of tungsten (W) which governs the electrical conductivity of the overall plug and first electrically conductive material plug 217b made of TiN/Ti (titanium nitride/titanium) for reducing the radiation of heat from heat electrode 218. Heater electrode 218 of Ti has a bottom surface held in contact with the upper surface of first electrically conductive material plug 217b made of TiN/Ti (titanium nitride/titanium).

First and second electrically conductive material plugs 212b, 217b are held in contact with each other through respective side surfaces thereof. Heater electrode 218 and second electrically conductive material plug 212b made of tungsten (W) do not overlap each other. Therefore, second electrically conductive material plug 212b of tungsten (W) is not present immediately below heater electrode 218.

In FIG. 13, the gate electrode of an NMOS transistor comprises a laminated assembly of doped silicon layer 232 having a thickness of 100 nm, tungsten silicide layer 234 having a thickness of 100 nm, and nitride film 236 having a thickness of 100 nm, which are surrounded by side wall 230 of silicon nitride film ($Si_3N_4$). This structure is different from the structure of the phase-change memory device shown in FIG. 8.

Electrically conductive material layers 232, 234 of the gate electrode have side and upper surfaces covered with insulating layers 230, 236 to prevent a short circuit from occurring between themselves and contact plug of different kinds of material 104 that is positioned close to the gate electrode.

The device shown in FIG. 13 includes stacked interlayer insulating films 238, 240 comprising TEOS oxide films and insulating film 264 comprising an oxide film disposed on interlayer insulating film 240. Insulating film 264 has opening Q defined therein to expose the upper surface of heater electrode 218 disposed in interlayer insulating film 240. GST film 300 serving as a phase-change layer is deposited on insulating film 264.

Fourth Embodiment

Figure 14:
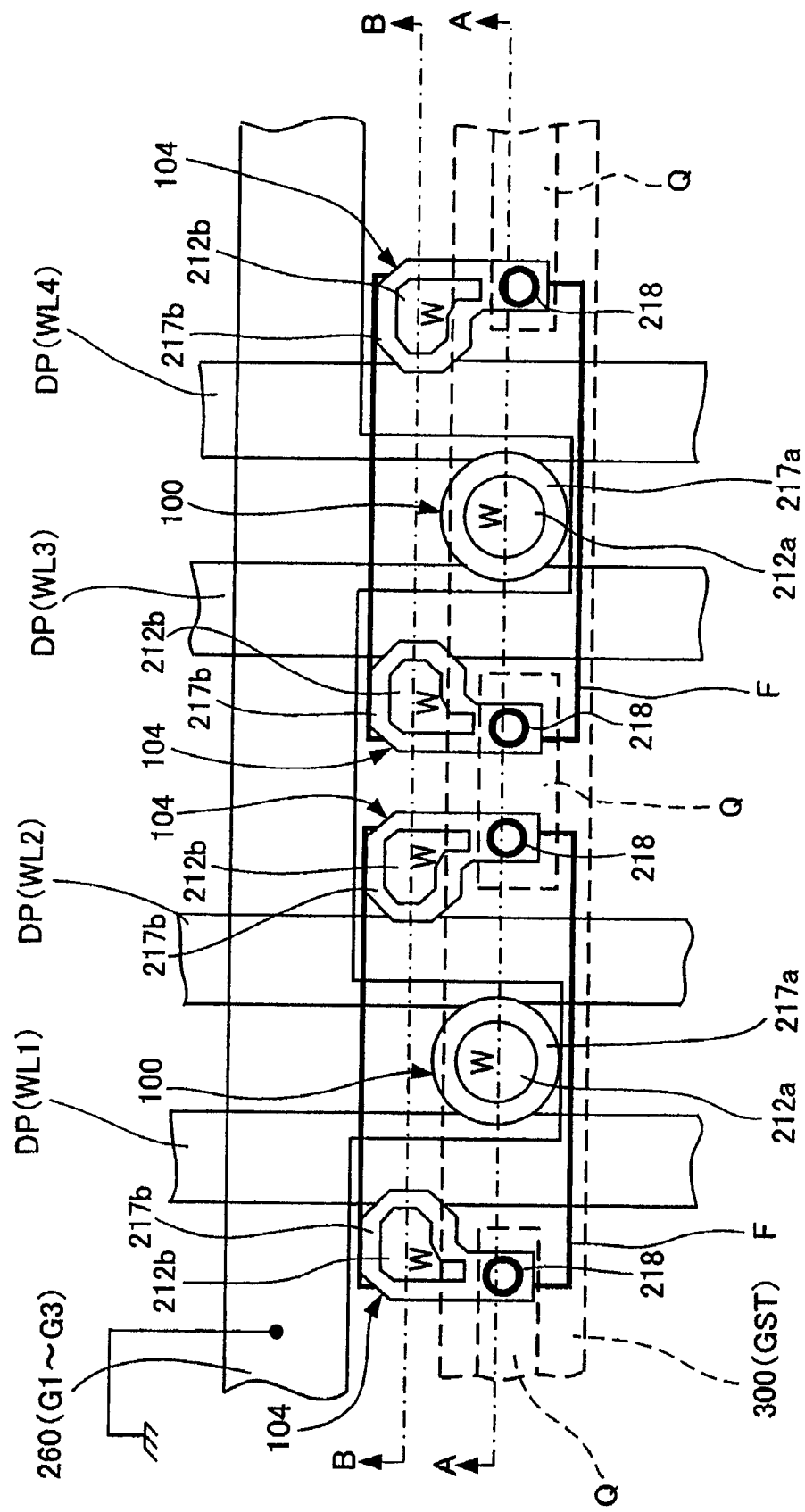
FIG. 14 is a plan view showing by way of example another layout of elements and interconnects in a memory cell area of the phase-change memory device (phase-change memory IC) shown in FIG. 11.

FIG. 14 is a plan view showing by way of example another layout of elements and interconnects in a memory cell area of the phase-change memory device (phase-change memory IC) shown in FIG. 11. Those parts in FIG. 14 which are identical to those shown in FIG. 12 are denoted by identical reference characters.

In FIG. 14, ground potential plug 100 comprises first electrically conductive material plug 217a made of TiN/Ti and second electrically conductive material plug 212a made of tungsten (W).

Contact plug of different kinds of material 104 comprises first electrically conductive material plug 217b made of TiN/Ti and second electrically conductive material plug 212b made of tungsten (W). Contact plug of different kinds of material 104 has a P-shaped planar shape (see FIG. 10A).

In FIG. 14, region F is a field region (device forming region). Four vertical interconnects DP extend through the memory cell area. These vertical interconnects DP comprise respective doped silicon layers serving as respective word lines WL1 through WL4 and doubling as the gate electrodes of MOS transistors.

GST film 300 serving as a phase-change layer extends horizontally through the memory cell area. Heater electrodes 218 are connected to GST film 300 in joint regions Q which are free of an insulating film. Joint region Q extends between two adjacent heater electrodes 218 to provide a wide positioning margin as will be described later.

Figure 5:
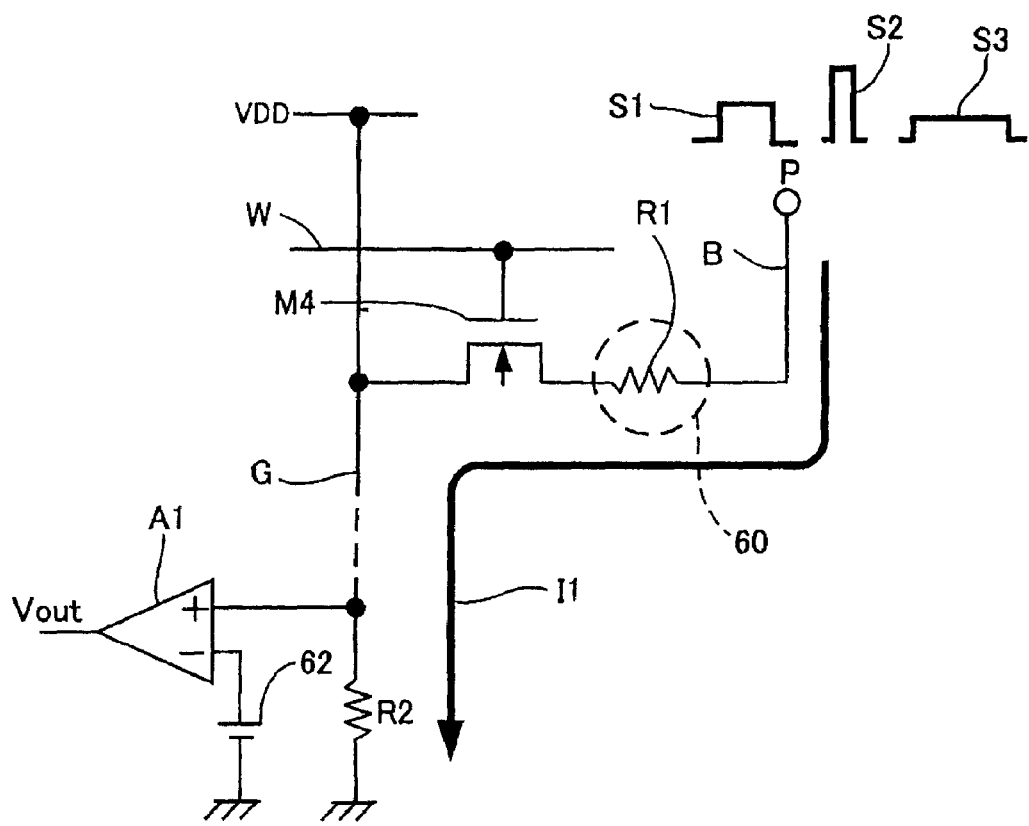
FIG. 5 is a circuit diagram showing the manner in which a phase-change memory device (phase-change memory IC) operates in the read mode.
Figure 6:
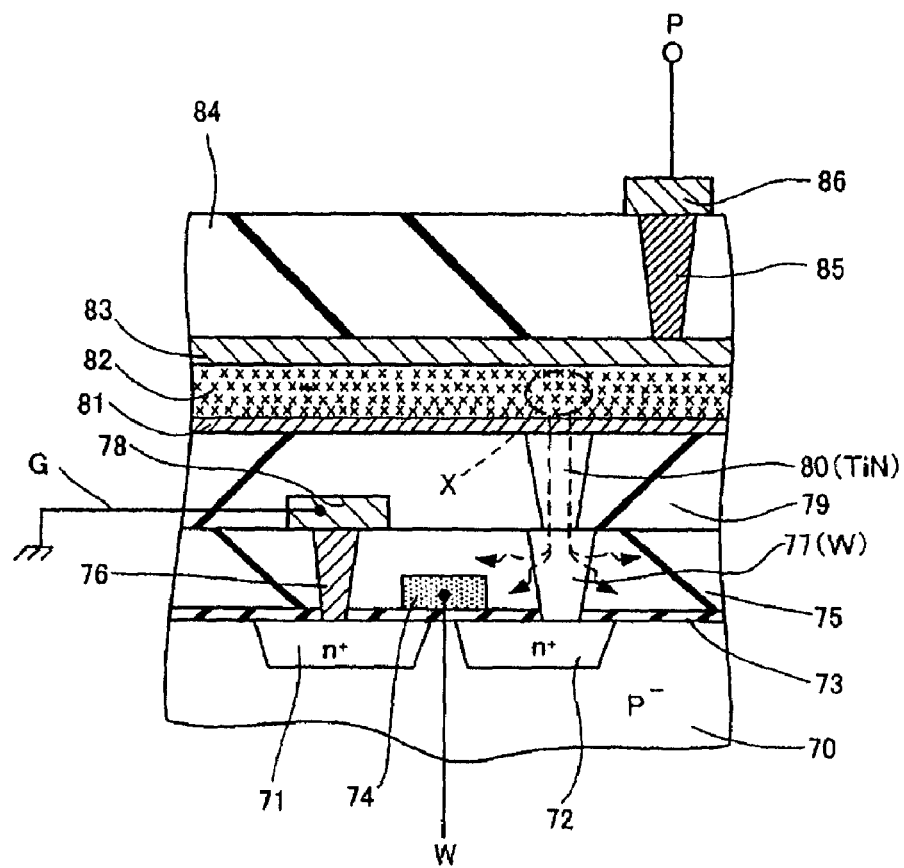
FIG. 6 is a fragmentary cross-sectional view showing specific structural details of a memory cell of a phase-change memory IC and illustrating problems thereof.

Ground potential interconnect 260, which corresponds to ground lines G1 through G3 in FIG. 5, is made of tungsten (W) and connects ground potential plug 100 to ground.

A method of manufacturing the cross-sectional structure of the device taken along line A-A of FIG. 14 will be described below with reference to FIGS. 15 through 20. FIGS. 15 through 20 are cross-sectional views at each of major manufacturing steps, which are illustrative of a method of manufacturing the cross-sectional structure of the device taken along line A-A of FIG. 14. FIG. 21 is a cross-sectional view of the device taken along line B-B of FIG. 14.

Figure 15:
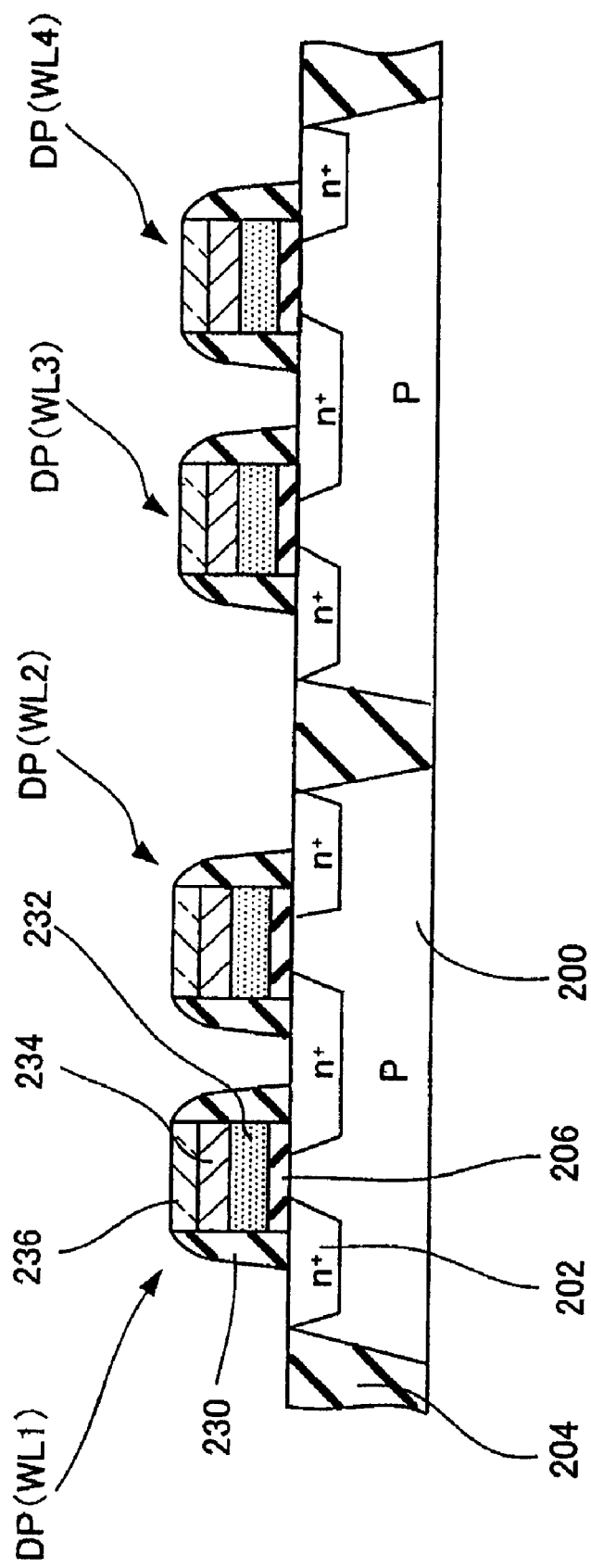
FIG. 15 is a cross-sectional view in step 1 which is illustrative of a method of manufacturing a cross-sectional structure of the device taken along line A-A of FIG. 14.

(1) Step 1 (FIG. 15):

As shown in FIG. 15, STIs (Shallow Trench Isolations) 204 are formed in p-type semiconductor substrate 200. A device forming region (field region) is surrounded by STIs 204. Then, film 232 of doped silicon and film 234 made of tungsten silicide are successively deposited each having a thicknesses of 100 nm, after which nitride film 236 is deposited. Then, a photolithographic mask is formed. Then, nitride film 236, film 234 of tungsten silicide, and film 232 of doped silicon are successively etched by anisotropic etching.

Then, a film of silicon nitride is formed on the entire surface of the semiconductor substrate, and side wall 230 is formed by anisotropic etching such as RIE (Reactive Ion Etching). Then, gate oxide film 206 on n-type diffused layer (source and drain layers) is selectively removed, thereby forming a contact area. The anisotropic etching is performed under conditions selected for keeping a selection ratio with respect to nitride film 236 as the uppermost layer of the gate electrode. The gate of the MOS transistor thus produced serves as word lines DP (WL1 through WL4) in the circuit shown in FIG. 11.

Figure 16:
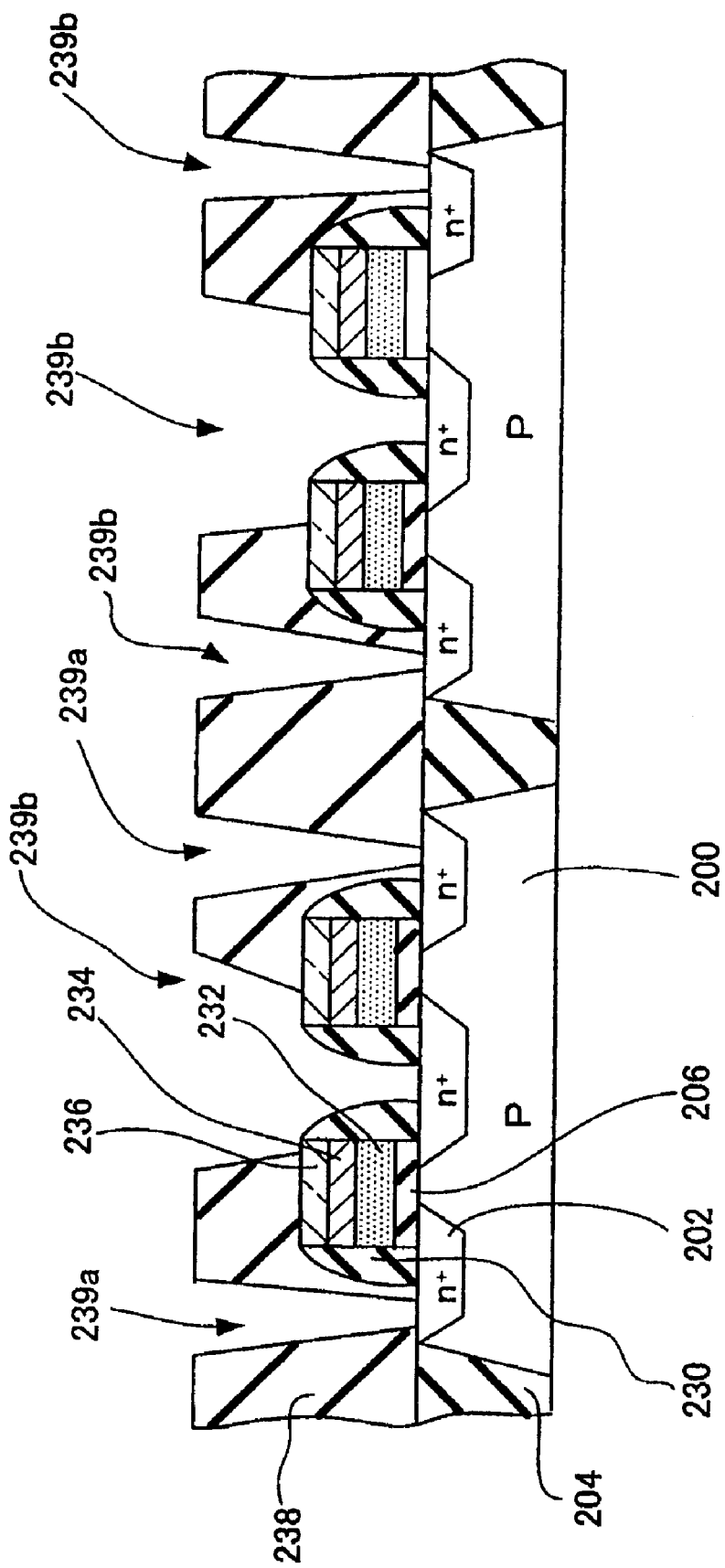
FIG. 16 is a cross-sectional view in step 2 which is illustrative of the method of manufacturing a cross-sectional structure of the device taken along line A-A of FIG. 14.

(2) Step 2 (FIG. 16):

As shown in FIG. 16, interlayer insulating film 238 in the form of a TEOS oxide film is deposited to a thickness of 700 nm, and then planarized by CMP. Then, interlayer insulating film 238 is patterned to form contact hole (opening) 239b having a circular planar shape and a diameter of 200 nm, for example, for forming ground potential plug 100, and contact hole 239a having an P-shaped planar shape (see FIGS. 14, 10A) for forming contact plug of different kinds of material 104. In FIG. 16, reference numeral 239a denotes a narrow groove of the contact hole which corresponds to the protrusion. The width of groove 239a has a width of 100 nm, for example.

Figure 17:
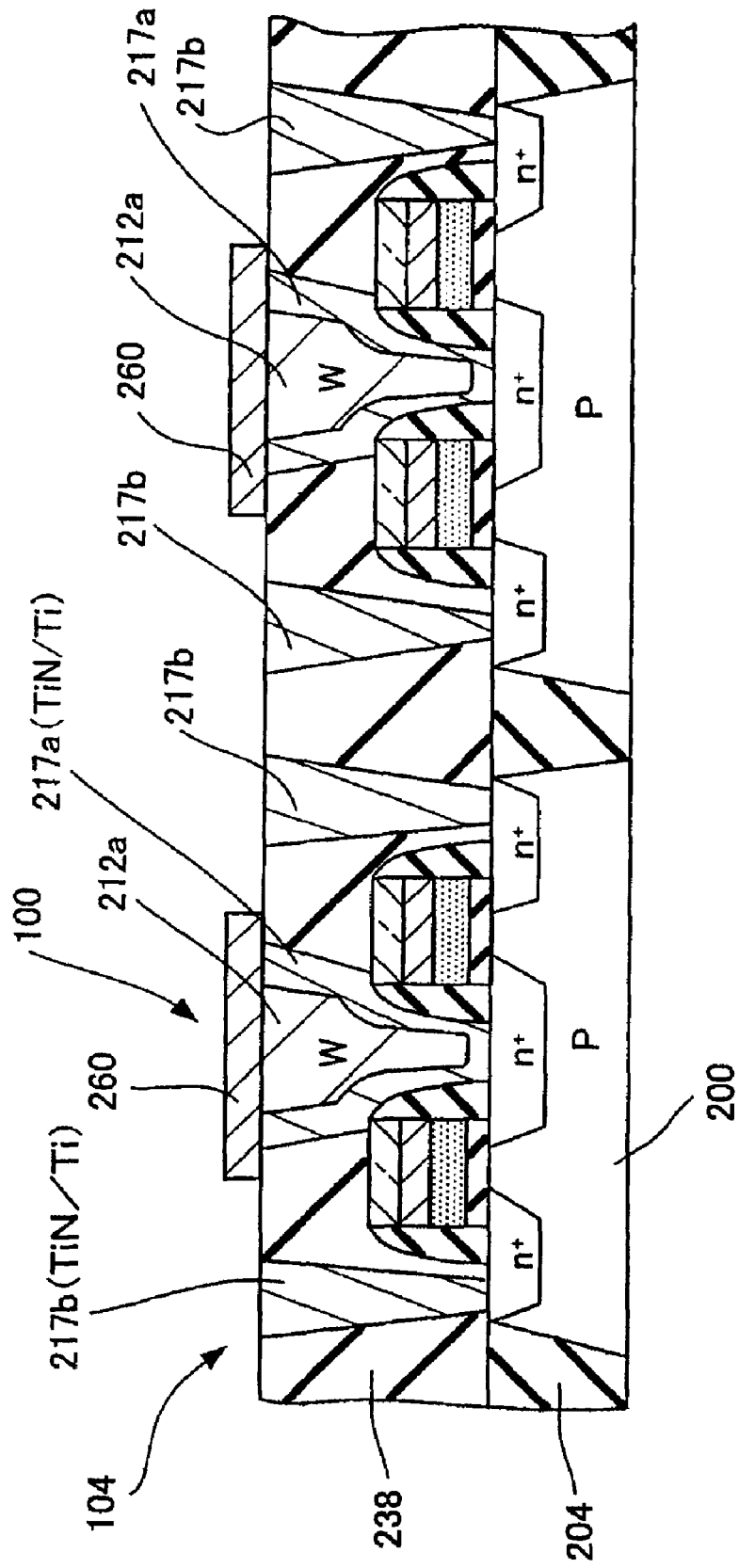
FIG. 17 is a cross-sectional view in step 3 which is illustrative of the method of manufacturing a cross-sectional structure of the device taken along line A-A of FIG. 14.

(3) Step 3 (FIG. 17):

A device structure shown in FIG. 17 is produced through the steps shown in FIGS. 9B through 9D. First, a TiN/Ti film is formed which includes a TiN film having a thickness of 15 nm and a Ti film having a thickness of 50 nm. At this time, groove 239a is fully filled with the TiN/Ti film. In wider contact hole 239b, only the bottom and side surfaces are covered with the TiN/Ti film. Then, a film of tungsten (W) is deposited to a thickness of about 250 nm. Thereafter, the tungsten (W) film and the TiN/TN film are continuously planarized. In this manner, ground potential plug 100 comprising first electrically conductive material plug 217a and second electrically conductive material plug 212a, and contact plug of different kinds of material 104 comprising first electrically conductive material plug 217b and second electrically conductive material plug 212b are produced.

Then, ground potential interconnect (ground interconnect) 260 is formed on ground potential plug 100 which comprises first electrically conductive material plug 217a and second electrically conductive material plug 212a.

Figure 18:
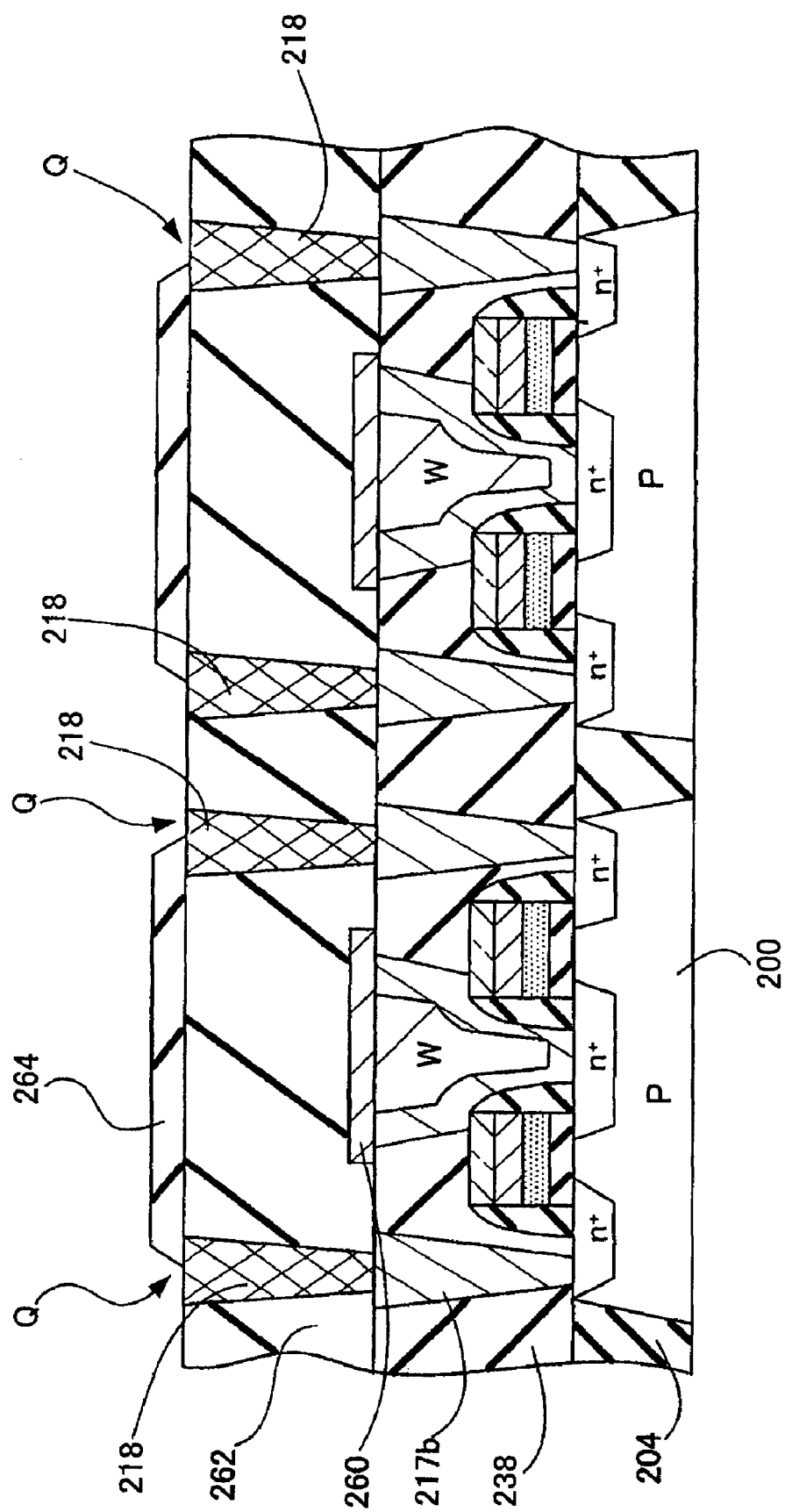
FIG. 18 is a cross-sectional view in step 4 which is illustrative of the method of manufacturing a cross-sectional structure of the device taken along line A-A of FIG. 14.

(4) Step 4 (FIG. 18):

In FIG. 18, interlayer insulating film, e.g., an HDP (High Density Plasma) oxide film, 262 is formed. Then a contact hole having a width of 60 nm which will be filled with a heater electrode is formed in interlayer insulating film 262. Then, a titanium nitride (TiN) film is deposited by CVD and then planarized by CMP, thereby forming heater electrode 218.

Then, oxide film 264 is deposited on interlayer insulating film 262 by plastic CVD, and then patterned to form joint regions Q which are free of insulating film 264.

It is to be noted that each of joint regions Q extends between two adjacent heater electrodes 218. The joint region extending between the two adjacent heater electrodes necessarily results in the formation of a slender opening pattern. Such a slender opening pattern is formed, i.e., an extended electrode layer and an insulating film are successively produced, more easily than if a single circular opening pattern, i.e., a pattern having an area small enough to expose the upper surface of one heater electrode only, is formed. Specifically, if a single circular opening pattern is formed, then when the opening pattern and the heater electrode are largely positionally shifted from each other, the probability that the upper surface of the heater electrode will not be exposed, i.e., a contact failure will occur, tends to be high. On the other hand, if a slender opening pattern is formed, then even when the opening pattern and the heater electrode are largely positionally shifted from each other in a longitudinal direction of the opening pattern, since the opening extends laterally, the probability that the upper surface of the heater electrode will not be exposed, i.e., a contact failure will occur, tends to be low. Therefore, a large mask positioning margin is available when the opening pattern is to be formed, with the result that the opening pattern can be easily formed.

Figure 19:
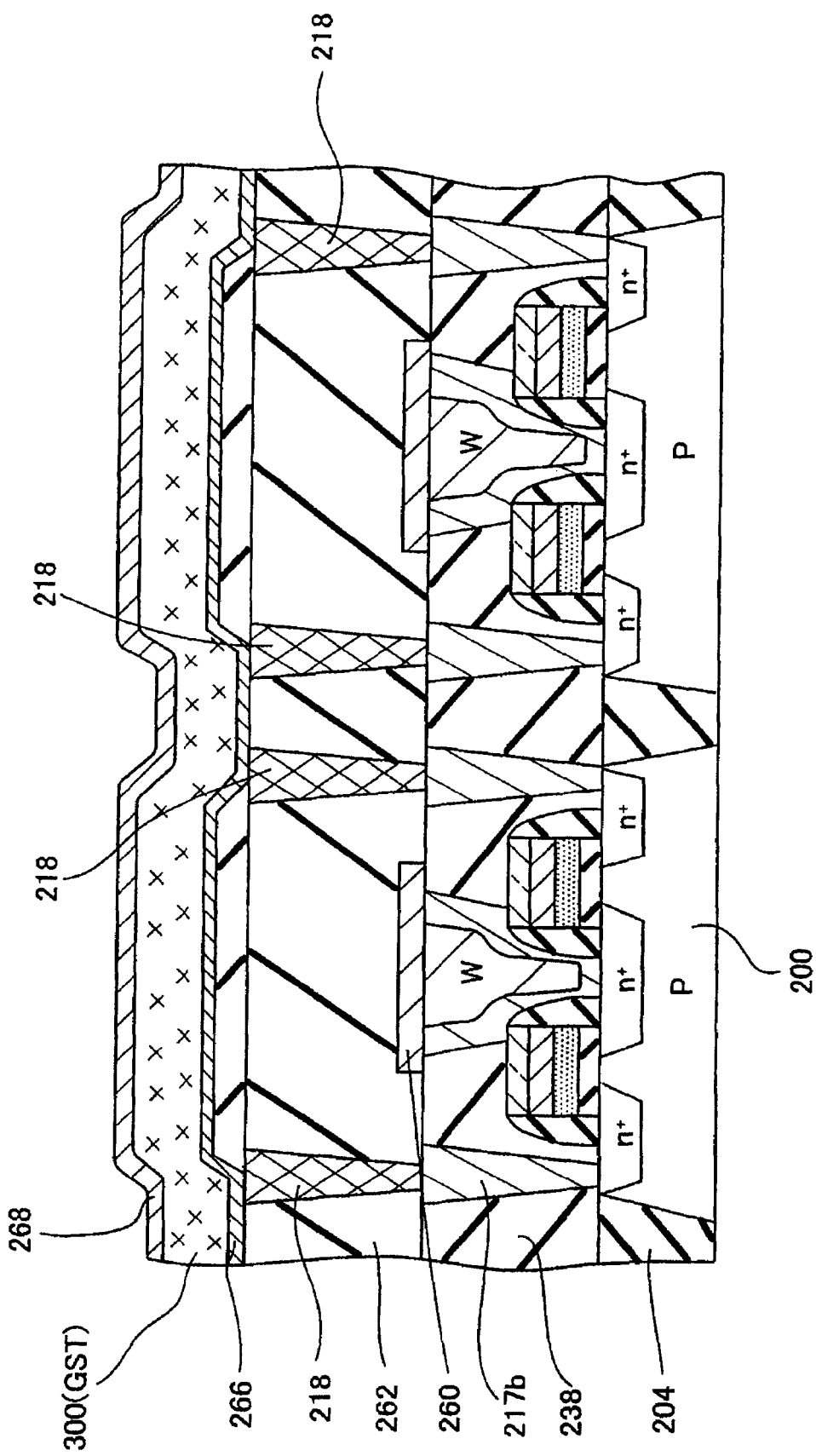
FIG. 19 is a cross-sectional view in step 5 which is illustrative of the method of manufacturing a cross-sectional structure of the device taken along line A-A of FIG. 14.

(5) Step 5 (FIG. 19):

In FIG. 19, after titanium (Ti) film 266 is deposited as a close contact layer to a thickness of about 1 nm, GST film 300 as a phase-change layer is formed, and then upper electrode layer 268 made of tungsten (W) is deposited to a thickness of 50 nm on GST film 300.

Figure 20:
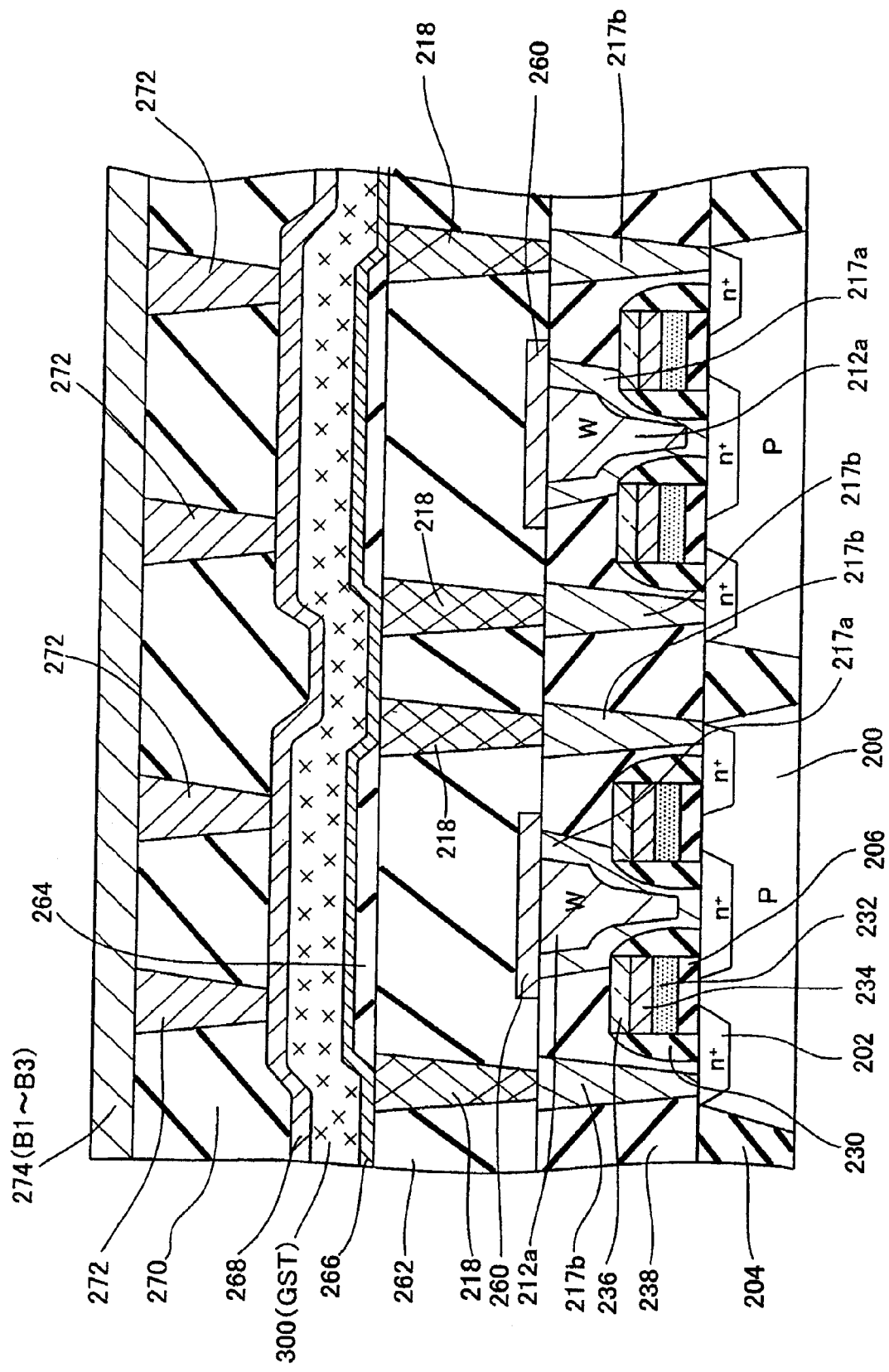
FIG. 20 is a cross-sectional view in step 6 which is illustrative of the method of manufacturing a cross-sectional structure of the device taken along line A-A of FIG. 14.
Figure 21:
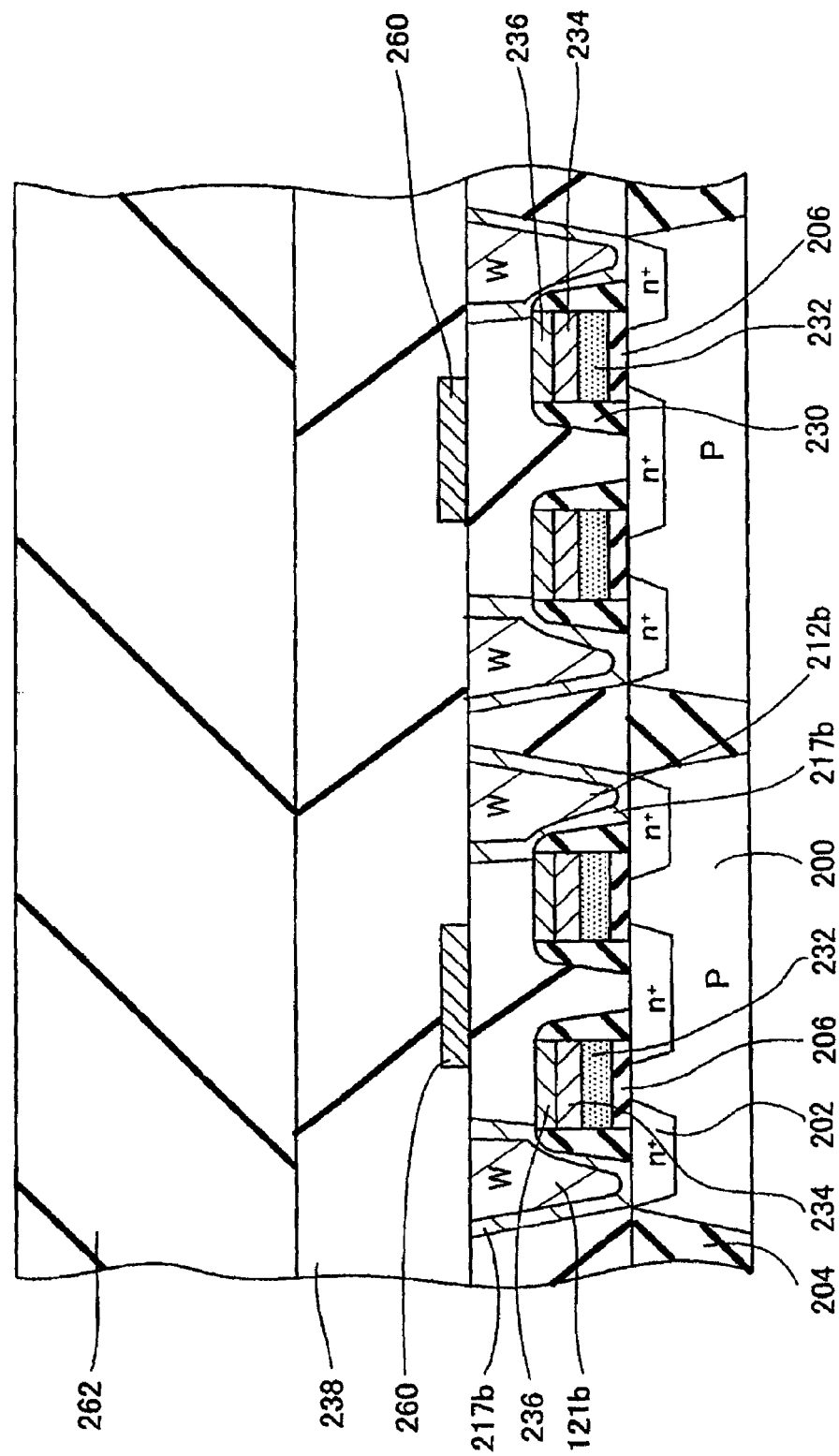
FIG. 21 is a cross-sectional view of the device taken along line B-B of FIG. 14.

(6) Step (6) (FIG. 20):

In FIG. 20, interlayer insulating film 270 is formed, and contact holes are formed in interlayer insulating film 270. Contact plugs 272 are deposited in the contact holes, and then layer 274 made of tungsten (W) is deposited and patterned on the surface formed so far. Layer 274 made of tungsten will provide bit lines B1 through B3 in the circuit arrangement shown in FIG. 11.

In this manner, the phase-change memory device (phase-change memory IC) having contact plug of different kinds of material is completed.

FIG. 21 is a cross-sectional view of the device taken along line B-B of FIG. 14.

FIG. 21 shows, in the cross section taken along line B-B, four NMOS transistors, four contact plug of different kinds of materials each including tungsten layer 212*b* and TiN/Ti film 217*b* functioning as a metal barrier as is conventional, and ground interconnects 260. An upper cross-sectional structure includes only interlayer insulating films 238, 262.

Fifth Embodiment

Figure 22:
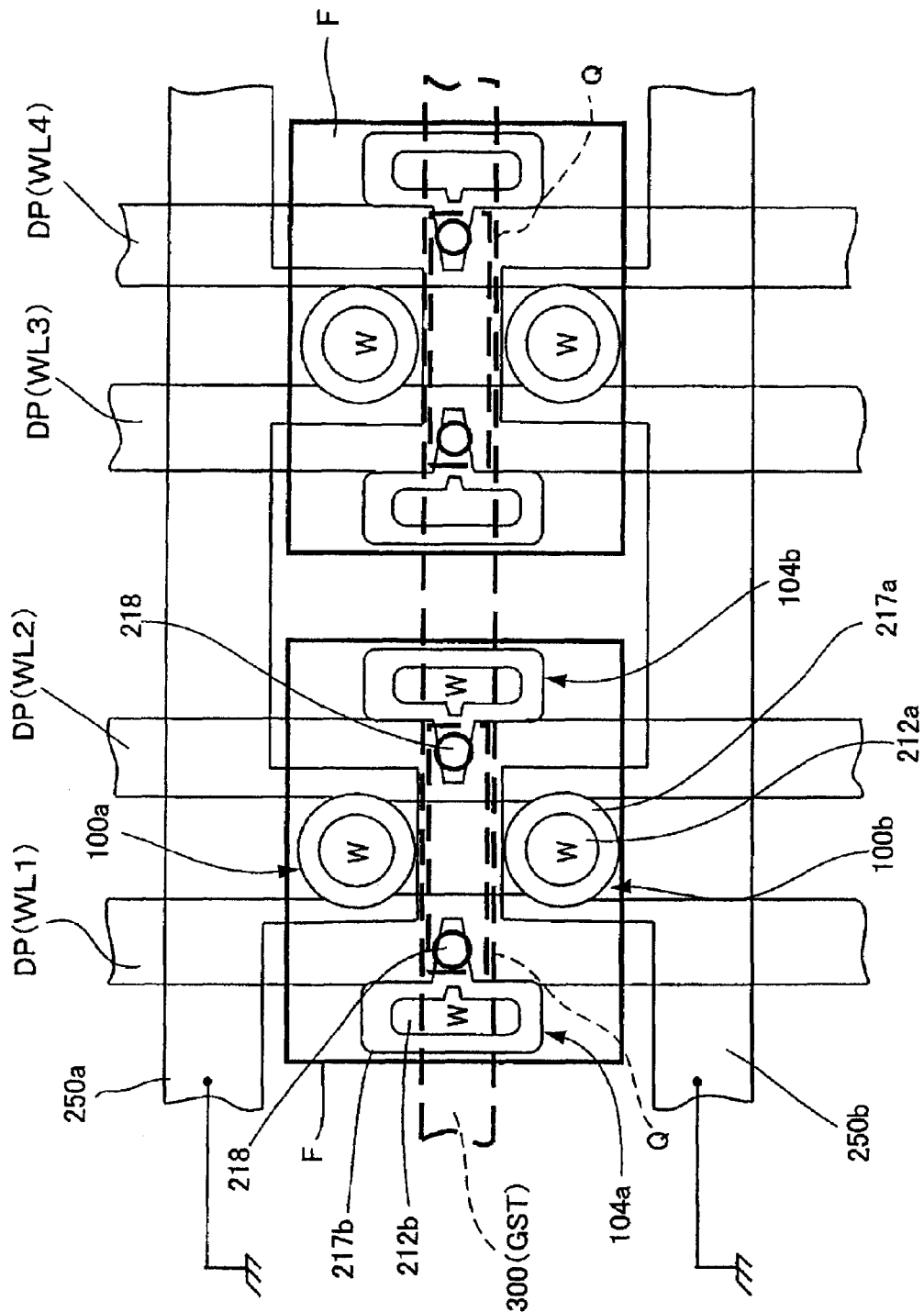
FIG. 22 is a plan view showing by way of example still another layout of elements and interconnects in a memory cell area of the phase-change memory device (phase-change memory IC) shown in FIG. 11.

FIG. 22 is a plan view showing by way of example still another layout of elements and interconnects in a memory cell area of the phase-change memory device (phase-change memory IC) shown in FIG. 11. Those parts in FIG. 22 which are identical to those shown in FIGS. 12, 14 are denoted by identical reference characters.

In FIG. 22, two ground potential plugs 100*a*, 100*b* are disposed in one field region F, and two ground potential interconnects (ground interconnects) 250*a*, 250*b* are provided in association with respective ground potential plugs 100*a*, 100*b*.

Each of ground potential plugs 100*a*, 100*b* comprises first electrically conductive material plug 217*a* made of TiN/Ti and second electrically conductive material plug 212*a* made of tungsten (W).

In FIG. 22, protrusion-type contact plug of different kinds of materials 104*a*, 104*b*, which are T-shaped as shown in FIG. 10C, are provided in one field region F. Each of contact plug of different kinds of materials 104*a*, 104*b* comprises first electrically conductive material plug 217*b* made of TiN/Ti and second electrically conductive material plug 212*b* made of tungsten (W).

Since two ground potential plugs 100*a*, 100*b* can be positioned close to each other, the parasitic resistance of ground lines of the electronic circuit is reduced, resulting in a stable circuit operation.

Sixth Embodiment

Figure 23:
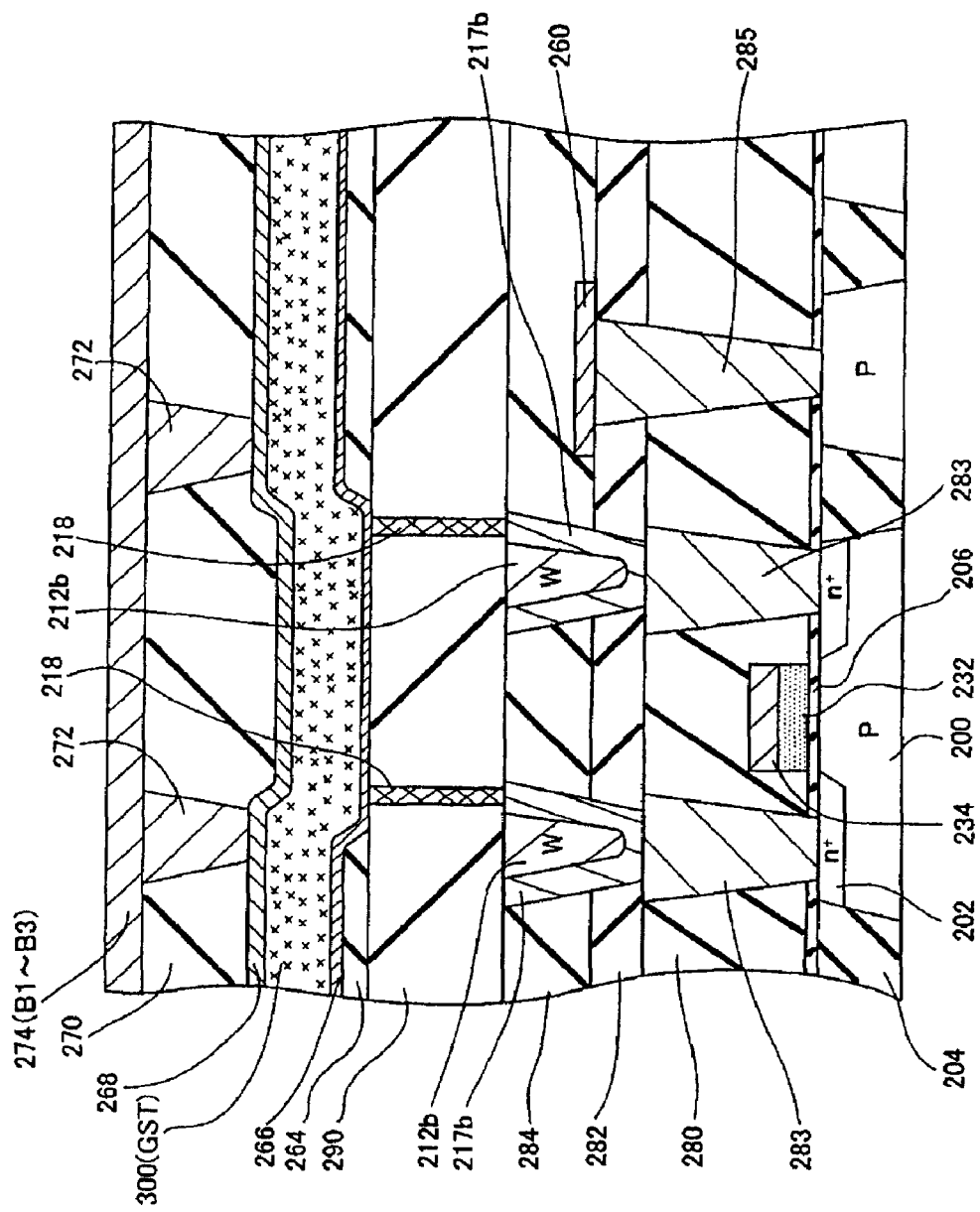
FIG. 23 is a cross-sectional view showing another cross-sectional structure of a phase-change memory device according to the present invention in which a contact electrode is held in contact with a source-drain layer of an NMOS transistor and a contact plug of different kinds of material is held in contact with the contact electrode.

FIG. 23 is a cross-sectional view showing another cross-sectional structure of a phase-change memory device according to the present invention in which a contact electrode is held in contact with a source-drain layer of an NMOS transistor and a contact plug of different kinds of material is held in contact with the contact electrode. Those parts in FIG. 23 which are identical to those shown in previous figures are denoted by identical reference characters.

In FIG. 23, the region where NMOS transistors are disposed, the region where heater electrodes 218 are disposed, and the region above heater electrodes 218 are identical to those in the previous embodiments.

However, contact electrodes 283 are held in contact with source-drain layer 202 of an NMOS transistor, and contact plug of different kinds of materials, each comprising TiN/Ti films 217*a*, 217*b*, are held in contact with contact electrodes 283. In FIG. 23, reference characters 280, 282, 284, 290 denote interlayer insulating films and reference character 260 denotes a ground potential interconnect (ground interconnect).

The preferred embodiments of the present invention have been described above. However, the present invention is not limited to the illustrated embodiments, but various changes and modifications may be made therein without departing from the scope of the present invention.

Figure 2A:
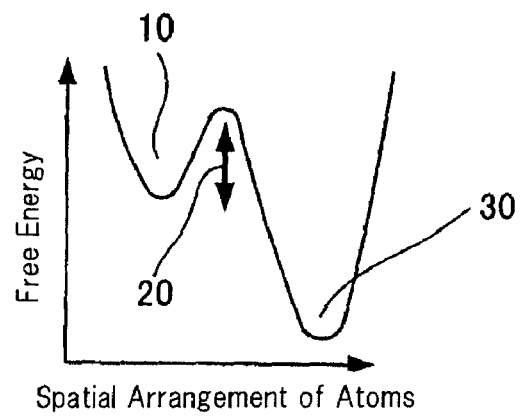
FIGS. 2A and 2B are diagrams illustrative of the principles of a phase-change memory.
Figure 2B:
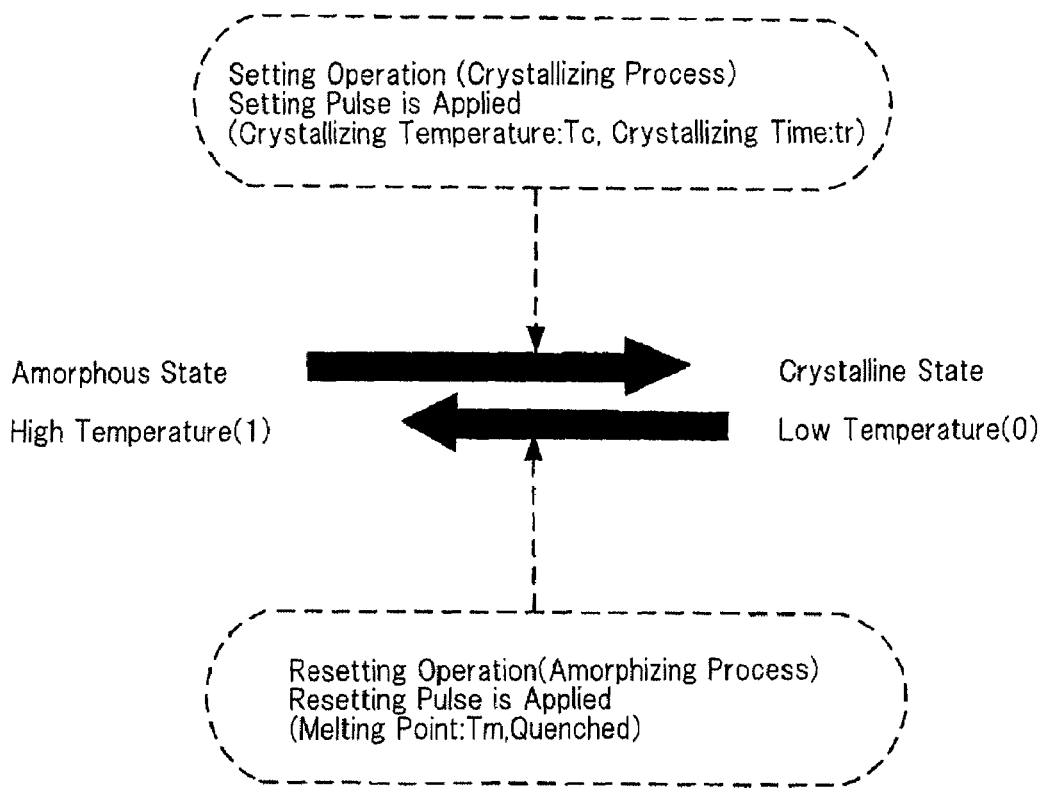
Figure 3A:
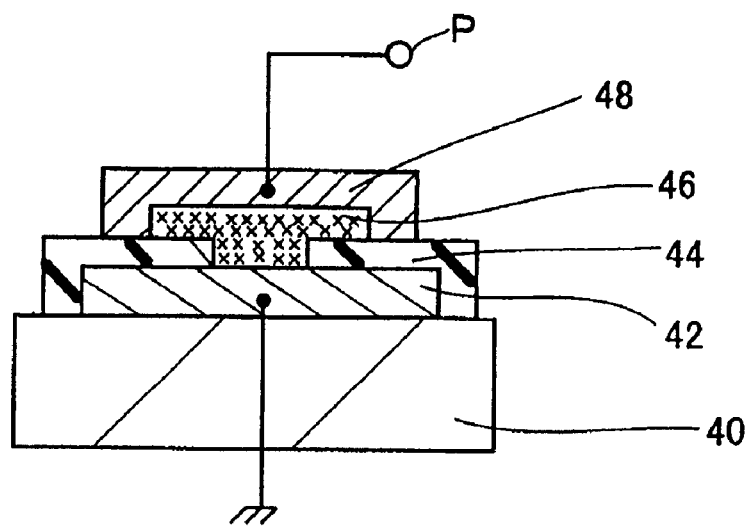
FIGS. 3A through 3D are diagrams illustrating a basic structure of a phase-change memory device and the manner in which the phase-change memory device is set and reset.
Figure 3B:
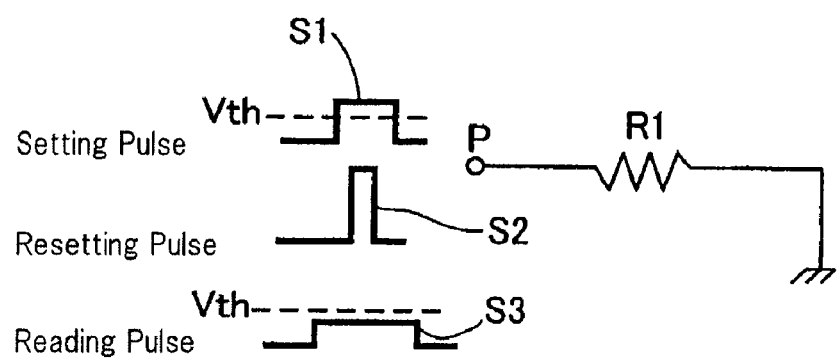
Figure 3C:
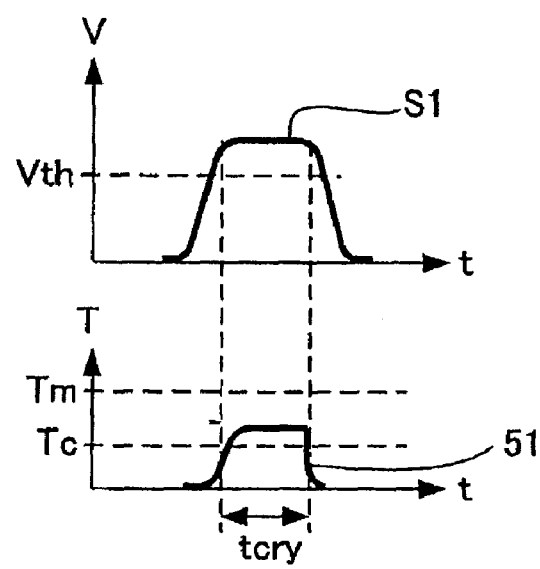
Figure 3D:
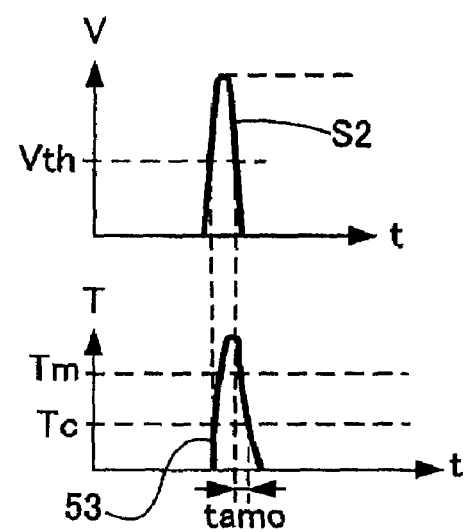
Figure 4:
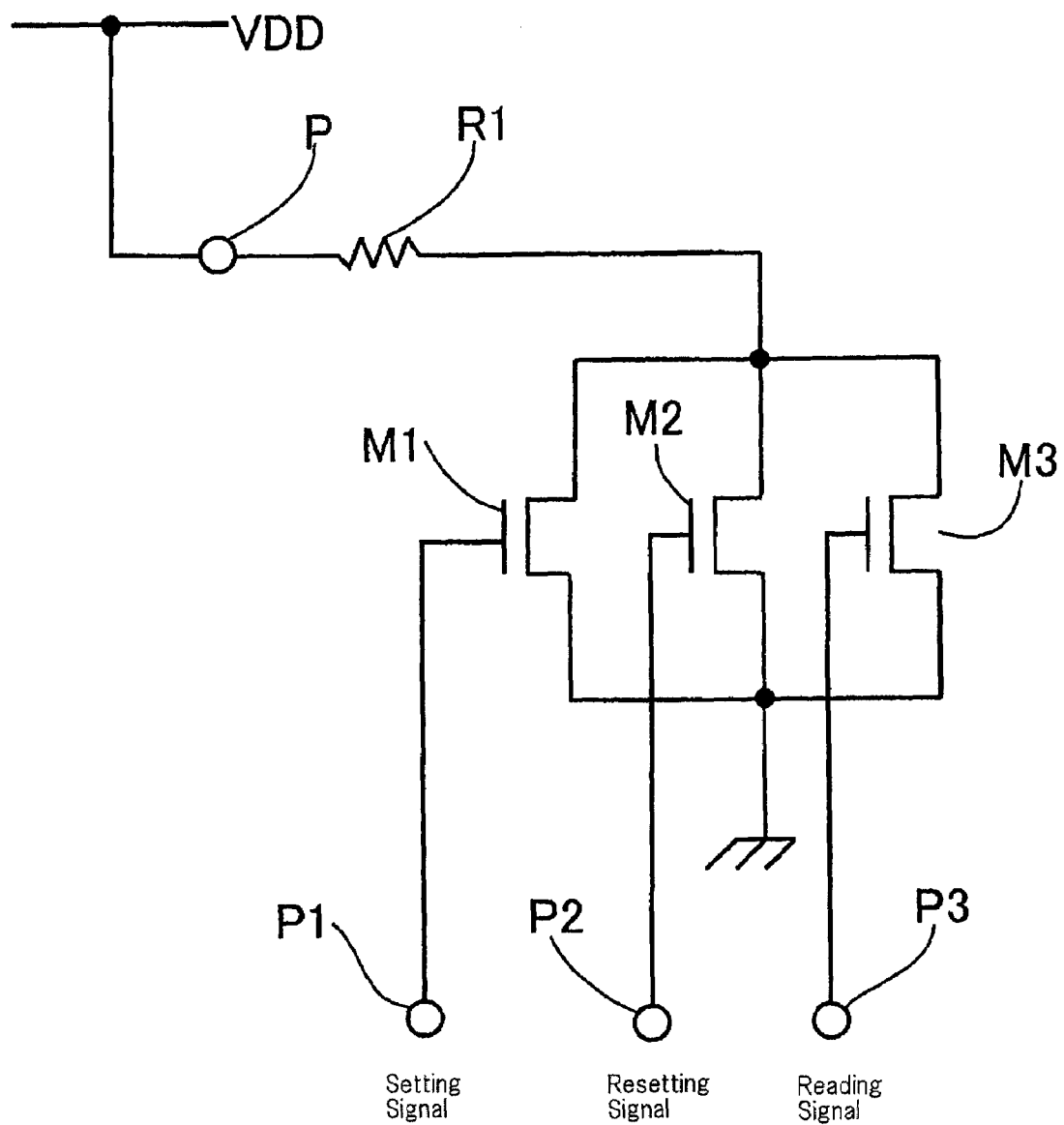
FIG. 4 is a circuit diagram of a circuit arrangement of the phase-change memory device.

For example, MOS transistors of memory cells may be replaced with various switching elements such as bipolar transistors, junction diodes, Schottky barrier diodes, or the like. The phase-change layer may be made of a material other than the chalcogenide semiconductor. The phase-change memory IC may have the circuit arrangement shown in FIG. 4 in which pulses of different waveforms are not input, but differently sized transistors are selectively turned on to draw a current.

According to the present invention, as described above, a contact plug of different kinds of material is used which comprises a first electrically conductive material plug made of a material having low thermal conductivity that is held in contact with a heater electrode, and a second electrically conductive material plug made of a material having low resistance that is held in contact with an electrically conductive layer. The contact plug of different kinds of material is effective to reduce the radiation of heat near the heater electrode, i.e., to improve the thermal efficiency when data is written in the phase-change memory device, in particular when the phase-change memory device is reset, and also to reduced the resistance of the electric circuit.

Since the heater electrode does not overlap the second electrically conductive material plug, heat transferred through the heater electrode is transmitted to the first electrically conductive material plug, but not to the second electrically conductive material plug directly therebeneath.

The portion which is held in contact with the heater electrode is made of a material having low thermal conductivity for reduced heat radiation. Therefore, other electrodes and interconnects may be made of a metal material having low conductivity such as tungsten (W) or aluminum (Al) or copper (Cu) that is used in silicon-based LSI circuits. Accordingly, a greater choice of materials that can be used is available, making it possible to manufacture a large-scale phase-change memory device.

The contact plug of different kinds of material can be easily fabricated by changing the mask pattern used to form a contact hole in the interlayer insulating film, forming a contact hole such as a P-shaped contact hole, an L-shaped contact hole, or a T-shaped contact type, having a wider main body and a narrower protrusion, and filling the contact hole successively with different materials deposited to adjusted thicknesses. The contact plug of different kinds of material that can easily be fabricated allows phase-change memory devices to be mass-produced.

If the volume of the second electrically conductive material plug which is made of a good conductor is greater than the volume of the first electrically conductive material plug, then the electrical resistance of the contact plug of different kinds of material is governed by the second electrically conductive material plug. Therefore, the overall electrical resistance of the contact plug of different kinds of material can be sufficiently low, causing no circuit operation problems.

The first electrically conductive material plug may be made of a material which is similar or identical to the material of the heater electrode, and the second electrically conductive material plug may be made of a material which is similar or identical to the material of the ground potential interconnects and electrodes. Therefore, the present invention can be carried out without posing a large burden on the fabrication process.

It is desirable that the specific resistances of the materials of the first and second electrically conductive material plugs, i.e., the first and second electrically conductive materials, be different from each other by 10 times or more. The difference can essentially be achieved by using TiN (titanium nitride) as the first electrically conductive material and W (tungsten) as the second electrically conductive material. No problem arises in selecting materials.

According to the present invention, furthermore, the contact plug of different kinds of material can easily be formed according to a contact hole filling technique such as CVD or the like by adjusting the widths of the planar pattern and the grooves of the contact hole and also by adjusting the film thicknesses of the thin films of the first and second electrically conductive materials.

According to the present invention, it is possible to manufacture a large-scale phase-change memory device, i.e., a phase-change memory IC having switching elements for selecting memory cells, contact plug of different kinds of materials, heater electrodes, and electrode terminals, while satisfying contradictory requirements for reduced heat radiation and reduced electric resistance using general fabrication technology, i.e., without using special fabrication processes.

The contact plug of different kinds of material and the ground potential plug can simultaneously be produced by a common fabrication process. Therefore, the number of fabrication steps can be reduced.

The upper and side surfaces of the electrically conductive material layer (doped silicon layer, etc.) of the gate electrode are covered with an electrically insulating film to prevent a short circuit between the gate electrode and the contact plug of different kinds of material.

According to the present invention, both good electric properties and good thermal properties are achieved for the phase-change memory device, and a greater choice of materials that can be used to make electrodes and interconnects is available, making it possible to manufacture a large-scale phase-change memory device.

According to the present invention, both good electric properties and good thermal properties are achieved for the phase-change memory device by using the contact plug of different kinds of material, and a greater choice of materials that can be used to make electrodes and interconnects is available, making it possible to manufacture a large-scale phase-change memory device. Therefore, the present invention is useful to provide a phase-change memory device (phase-change memory IC) using a chalcogenide phase-change film, a method of manufacturing a contact plug of different kinds of material, and a method of manufacturing a phase-change memory device.

What is claimed is:

1. A phase-change memory device comprising:
   a phase-change layer;
   a heater electrode having an end held in contact with said phase-change layer;
   a contact plug of different kinds of material having a first electrically conductive material plug made of a first electrically conductive material and held in contact with the other end of said heater electrode, and a second electrically conductive material plug made of a second electrically conductive material having a specific resistance smaller than said first electrically conductive material, said first electrically conductive material plug and said second electrically conductive material plug being held in contact with each other through at least respective side surfaces thereof, said heater electrode and said second electrically conductive material plug being not in overlapping relation to each other; and
   an electrically conductive layer electrically connected to said second electrically conductive material plug.

2. The phase-change memory device according to claim 1, wherein said contact plug of different kinds of material has a planar shape including:
   a wider main body constructed of said second electrically conductive material plug; and
   a protrusion projecting from said main body and narrower than said main body, said protrusion being made of said first electrically conductive material, said heater electrode being connected to said protrusion.

3. The phase-change memory device according to claim 2, wherein said planar shape of said contact plug of different kinds of material is either P-shaped, L-shaped, or T-shaped.

4. The phase-change memory device according to claim 1, wherein said second electrically conductive material plug is greater in volume than said first electrically conductive material plug.

5. The phase-change memory device according to claim 1, wherein said first electrically conductive material of said first electrically conductive material plug includes a metal material which is a major constituent of said heater element, and said second electrically conductive material plug includes a metal material which is a major constituent of a ground potential electrode or an interconnect of said phase-change memory device.

6. The phase-change memory device according to claim 1, wherein said first electrically conductive material of said first electrically conductive material plug includes a metal material which is the same as a metal material of said heater element, and said second electrically conductive material plug includes a metal material which is a major constituent of a ground potential electrode or an interconnect of said phase-change memory device.

7. The phase-change memory device according to claim 1, wherein said first electrically conductive material of said first electrically conductive material plug comprises a metal which is any one of titanium (Ti), tantalum (Ta), molybdenum (Mo), niobium (Nb), zirconium (Zr) or tungsten (W), or a nitride of the metal, or a silicide of the metal.

8. The phase-change memory device according to claim 1, wherein said first electrically conductive material of said first electrically conductive material plug comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

9. The phase-change memory device according to claim 1, wherein said second electrically conductive material of said second electrically conductive material plug comprises a metal which is any one of tungsten (W), aluminum (Al), molybdenum (Mo) or copper (Cu), or a silicide of the metal.

10. The phase-change memory device according to claim 1, wherein the specific resistance of said first electrically conductive material of said first electrically conductive material plug is at least 10 times the specific resistance of said second electrically conductive material of said second electrically conductive material plug.

11. The phase-change memory device according to claim 1, wherein said first electrically conductive material plug comprises a plug formed by depositing titanium nitride (TiN) on a thin film made of titanium (Ti) disposed on the inner and bottom surfaces of a contact hole defined in an interlayer insulating film, and said second electrically conductive material plug comprises a plug formed by depositing tungsten (W) in a cavity which remains after said titanium nitride (TiN) is deposited.

12. The phase-change memory device according to claim 1, further comprising:
a switching element for selecting a memory cell; and
a ground potential connecting plug for connecting a ground potential to one pole of said switching element;
said one pole of said switching element being connected to the ground potential through said ground potential connecting plug, and another pole of said switching element being electrically connected to said second electrically conductive material plug of said contact plug of different kinds of material.

13. The phase-change memory device according to claim 12, wherein said ground potential connecting plug comprises a first electrically conductive material plug and a second electrically conductive material plug as said contact plug of different kinds of material.

14. A phase-change memory device comprising:
a switching element for selecting a memory cell, said switching element being disposed in or on a semiconductor substrate;
a contact plug of different kinds of material having a first electrically conductive material plug and a second electrically conductive material plug whose electrical conductivity and thermal conductivity is greater than that of said first electrically conductive material plug, said first electrically conductive material plug and said second electrically conductive material plug being held in contact with each other through at least respective side surfaces thereof;
a heater electrode connected to said first electrically conductive material plug, said heater electrode and said second electrically conductive material plug not being in overlapping relation to each other;
a phase-change layer connected to said heater electrode; and
an electrode layer connected to said phase-change layer.

15. The phase-change memory device according to claim 1, wherein said phase-change layer comprises a chalcogenide semiconductor layer.

16. The phase-change memory device according to claim 14, wherein said phase-change layer comprises a chalcogenide semiconductor layer.

17. A method of manufacturing a contact plug of different kinds of material of a phase-change memory device according to claim 1, comprising the steps of:
selectively patterning a portion of an interlayer insulating film disposed on a semiconductor substrate to form a contact hole having a planar shape including a wider main body and a protrusion projecting from said main body and narrower than said main body;
filling said contact hole with said first electrically conductive material to form said first electrically conductive material plug under such a condition that only said protrusion is fully filled; and
fully filling said main body of said contact hole with said second electrically conductive material to form said second electrically conductive material plug.

18. A method of manufacturing a phase-change memory device according to claim 1, comprising the steps of:
forming a switching element for selecting a memory cell, in or on a semiconductor substrate;
forming said contact plug of different kinds of material such that said second electrically conductive material plug is held in electrical contact with one pole of said switching element, by a method of manufacturing a contact plug of different kinds of material according to claim 17;
forming said heater electrode such that said heater electrode has a lower surface held in contact with an upper surface of said first electrically conductive material plug;
forming said phase-change layer such that said phase-change layer has a lower surface held in contact with an upper surface of said heater electrode; and
forming an electrode layer connected to at least a portion of an upper surface of said phase-change layer.

19. The method of manufacturing a phase-change memory device according to claim 18, wherein said step of forming said contact plug of different kinds of material includes the step of forming a ground potential plug for keeping another pole of said switching element at a ground potential, when said contact plug of different kinds of material is formed.

20. The method of manufacturing a phase-change memory device according to claim 18, wherein said switching element comprises an insulated-gate field-effect transistor, and when a gate electrode of said insulated-gate field-effect transistor is formed, an electrically insulating layer is formed on upper and side surfaces of an electrically conductive material layer of said gate electrode.

* * * * *